United States Patent
Kamikawa et al.

[11] Patent Number: 6,045,624
[45] Date of Patent: Apr. 4, 2000

[54] APPARATUS FOR AND METHOD OF CLEANING OBJECTS TO BE PROCESSED

[75] Inventors: Yuji Kamikawa, Koshi-machi; Satoshi Nakashima, Kikusui-machi; Kinya Ueno, Nirasaki, all of Japan

[73] Assignee: Tokyo Electron Limited, Tokyo, Japan

[21] Appl. No.: 08/936,521

[22] Filed: Sep. 24, 1997

[30] Foreign Application Priority Data

Sep. 27, 1996 [JP] Japan .................................... 8-256636

[51] Int. Cl.⁷ .................................................. B08B 3/00
[52] U.S. Cl. ........................ 134/30; 134/95.1; 134/61; 134/902; 134/26; 134/21; 15/302
[58] Field of Search .......................... 134/902, 61, 95.1, 134/95.2, 26, 30, 34, 36, 37, 21; 15/302; 34/443, 444, 445, 446, 448, 451, 452, 77, 78, 321, 428

[56] References Cited

U.S. PATENT DOCUMENTS

| | | | |
|---|---|---|---|
| 4,694,527 | 9/1987 | Yoshizawa | 134/61 X |
| 4,781,764 | 11/1988 | Leenaars | 134/34 |
| 4,868,996 | 9/1989 | Ohmori et al. | 34/392 |
| 5,024,744 | 6/1991 | Okabayashi | 204/194 |
| 5,156,173 | 10/1992 | Keyser et al. | 134/61 |
| 5,180,438 | 1/1993 | Hockh et al. | 134/21 |
| 5,265,632 | 11/1993 | Nishi | 134/133 |
| 5,315,766 | 5/1994 | Roberson, Jr. et al. | 34/409 |
| 5,369,891 | 12/1994 | Kamikawa | 34/78 |
| 5,571,337 | 11/1996 | Mohindra et al. | 134/7 |
| 5,608,974 | 3/1997 | Tanaka et al. | 34/78 |
| 5,671,764 | 9/1997 | Murakami et al. | 134/200 |
| 5,715,612 | 2/1998 | Schwenkler | 34/470 |
| 5,806,544 | 9/1998 | Kosic | 134/68 |
| 5,815,942 | 10/1998 | Wu et al. | 34/78 |

FOREIGN PATENT DOCUMENTS

| | | |
|---|---|---|
| 0 385 536 | 5/1990 | European Pat. Off. |
| 81230 | 3/1989 | Japan . |
| 326073 | 11/1994 | Japan . |

OTHER PUBLICATIONS

Koppenbrink et al, Particle Reduction on Silicon Wafers as a Result of Isopropyl Alcohol Vapor Displacement Drying After Wet Processing, Particles on Surface 2, Plenum Press, pp. 235–243, 1989.

*Primary Examiner*—Randy Gulakowski
*Assistant Examiner*—Alexander Markoff
*Attorney, Agent, or Firm*—Smith, Gambrell & Russell, LLP

[57] ABSTRACT

A cleaning apparatus and a cleaning method for restricting an occurrence of water marks on a surface of a object to be processed are provided. The cleaning apparatus is constructed so as to dry wafers W, which have been rinsed by DIW in a drying chamber 42, in a cooling system. Thus, the reaction between, for example, IPA, DIW etc. and silicon in surfaces of the wafers W is inactivated to cause the surfaces to be oxidized with difficulty, so that it is possible to restrict the occurrence of the water marks on the surfaces.

16 Claims, 18 Drawing Sheets

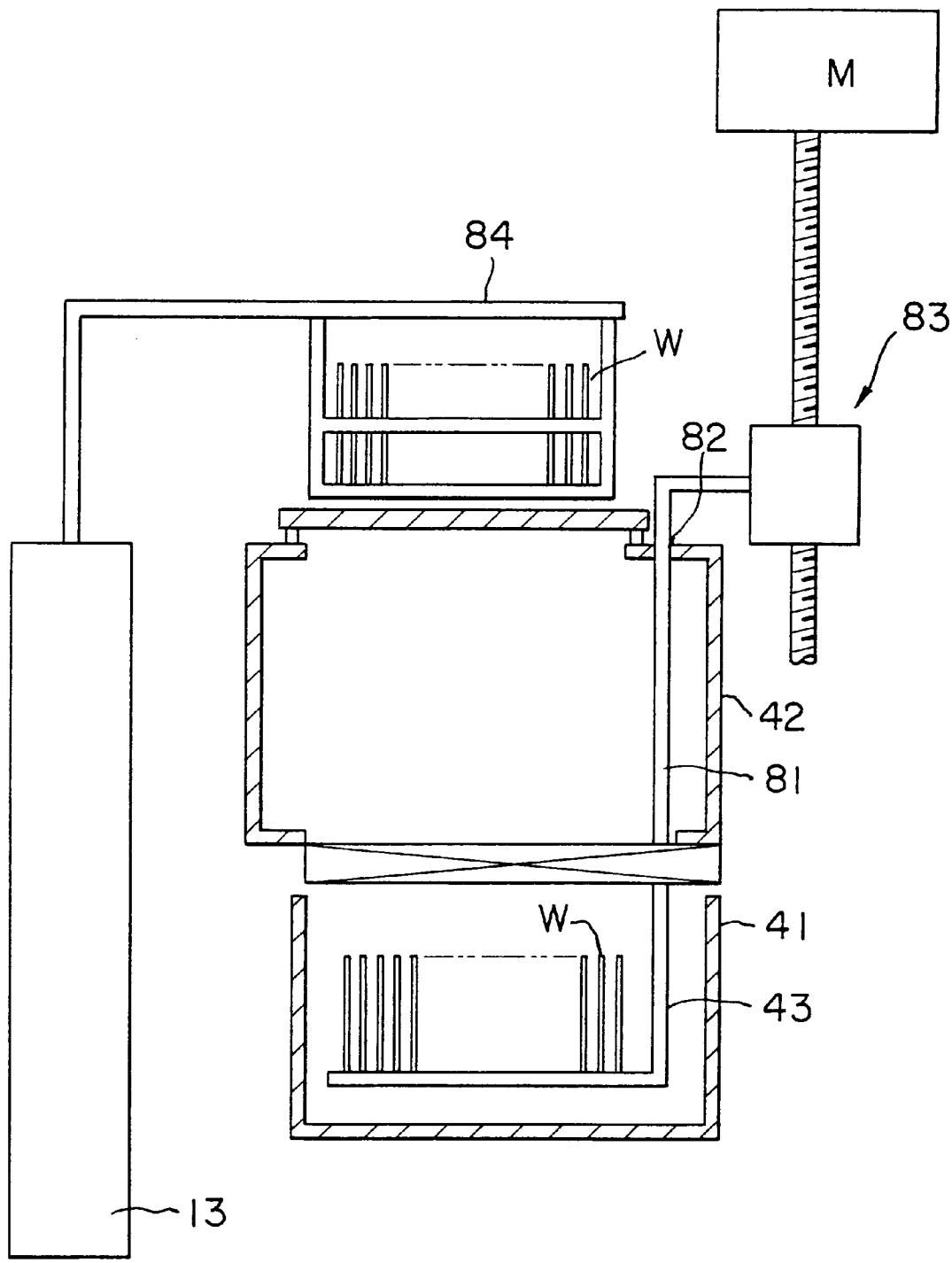
F I G. 5

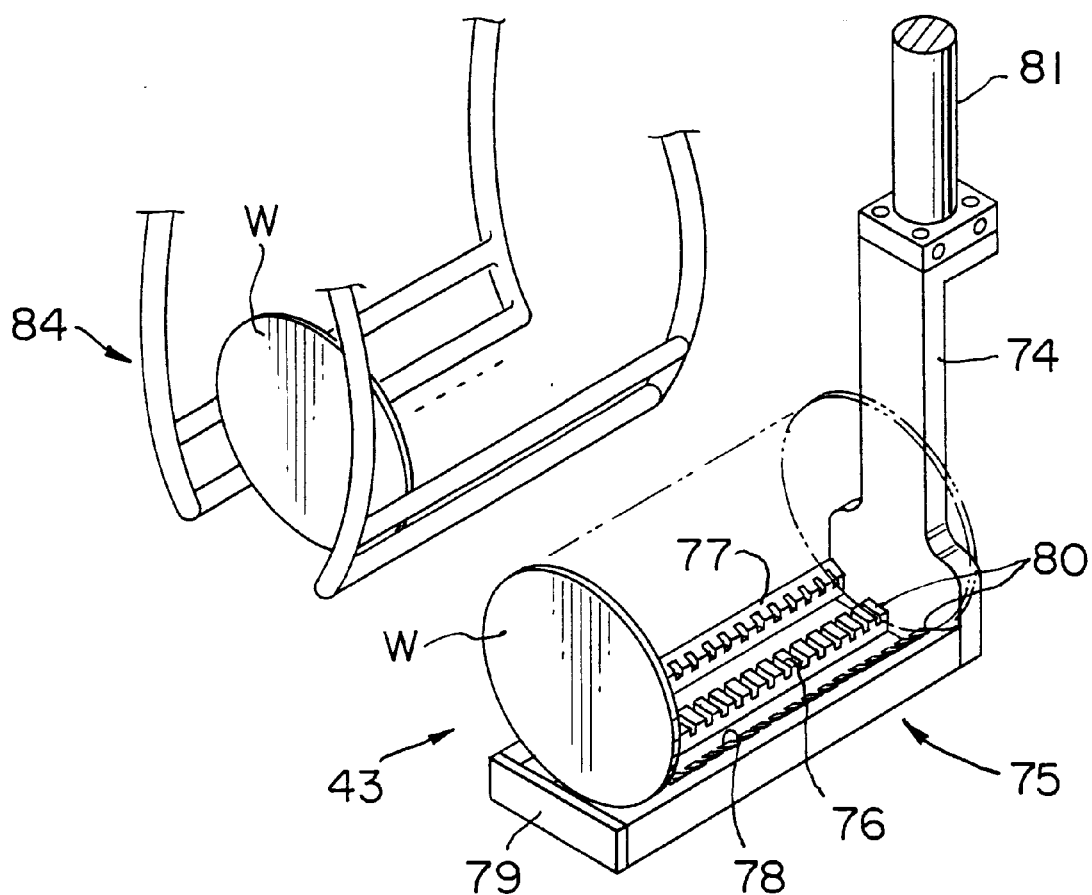
F I G. 10

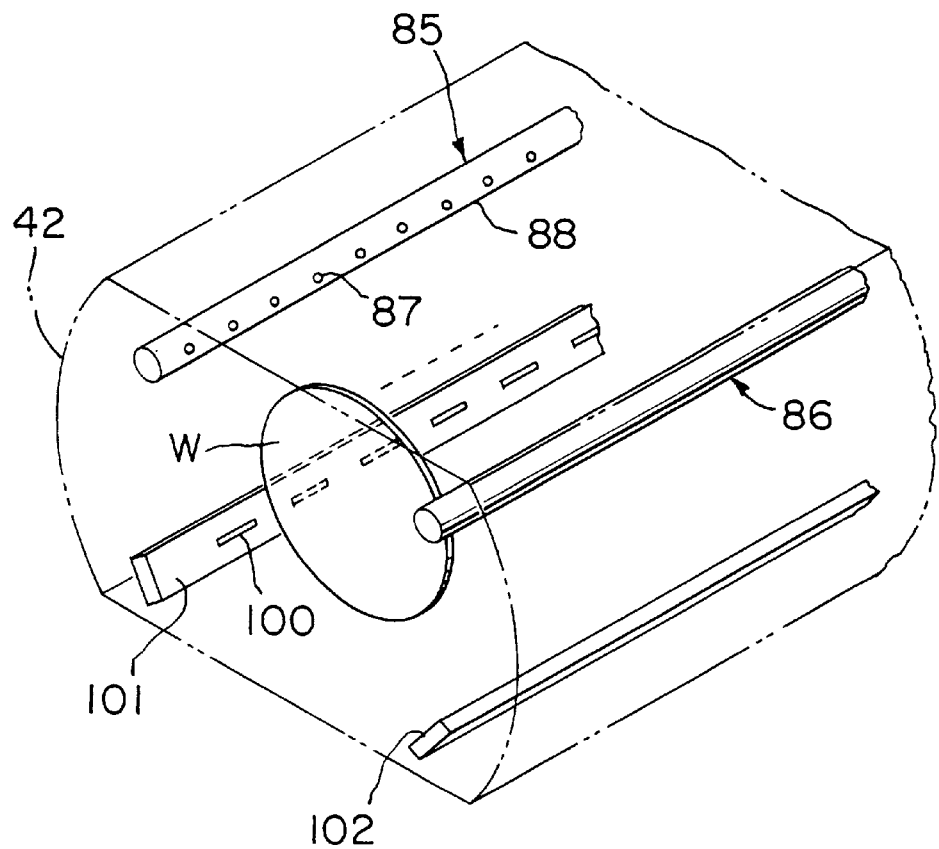
F I G. 11
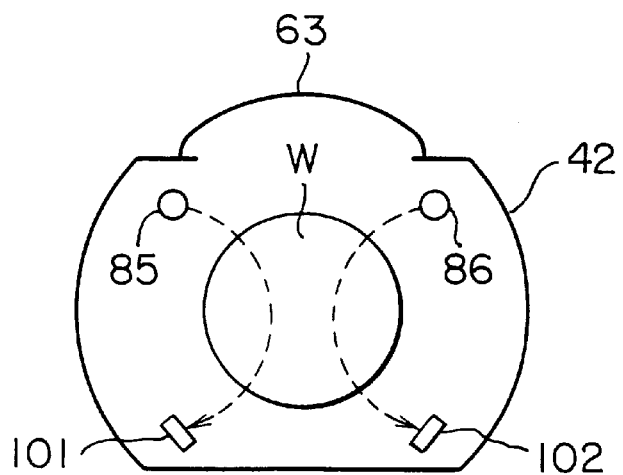
F I G. 12

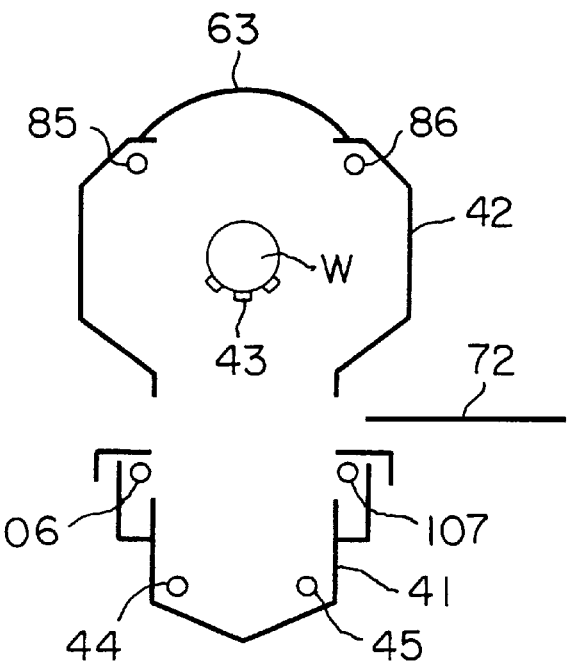
F I G. 16
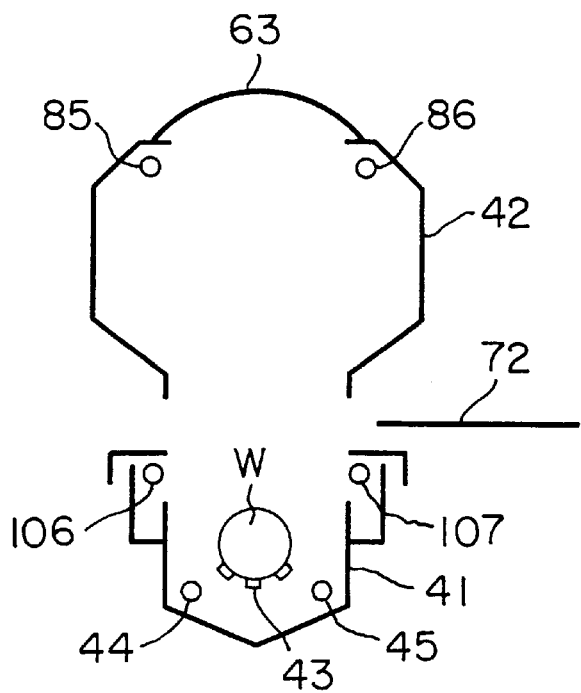
F I G. 17

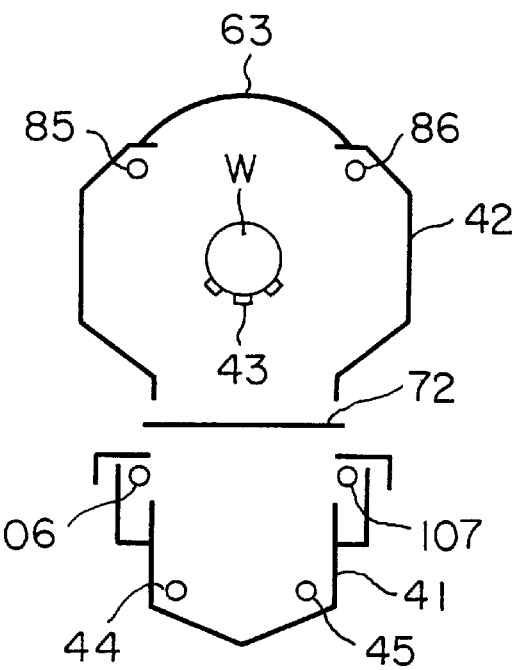
F I G. 22
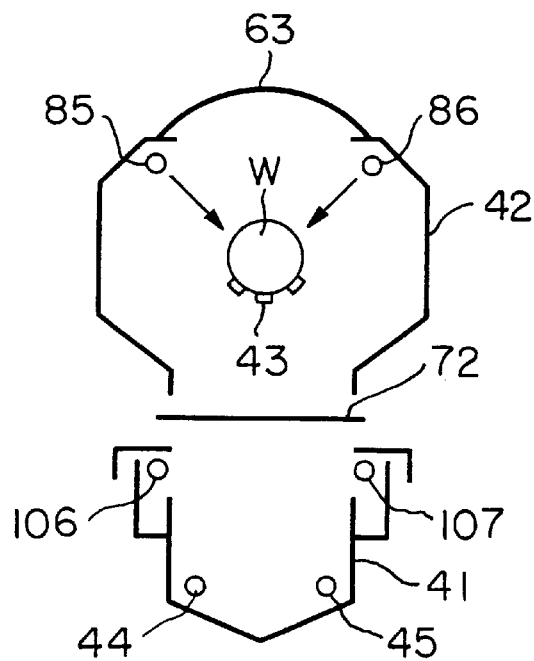
F I G. 23

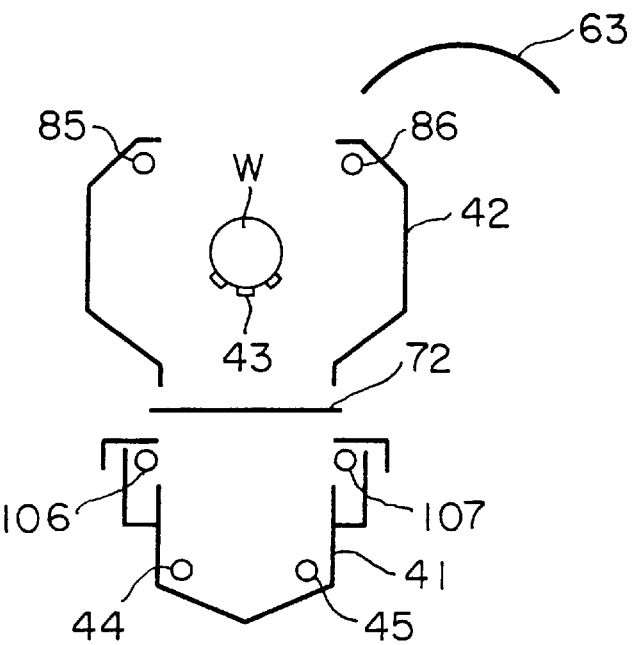
F I G. 24
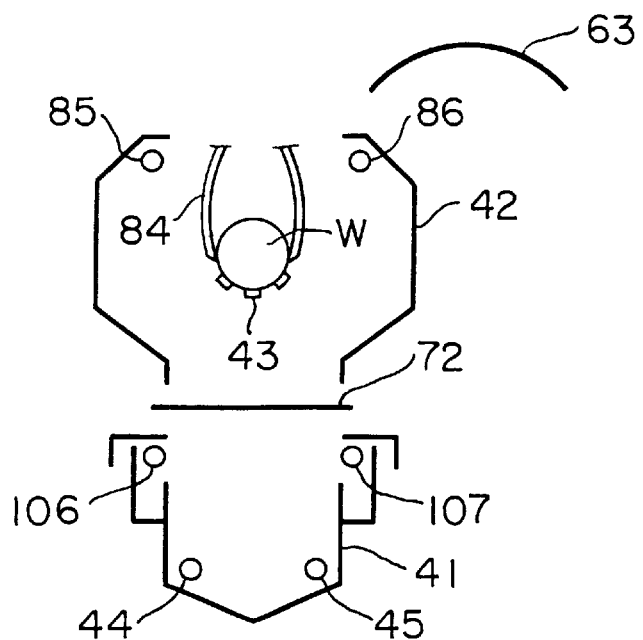
F I G. 25

APPARATUS FOR AND METHOD OF CLEANING OBJECTS TO BE PROCESSED

BACKGROUND OF THE INVENTION

The present invention relates to a cleaning apparatus and a cleaning method, by which objects to be processed, such as semiconductor wafers and glass substrates for a LCD (liquid crystal display) unit etc., are immersed and cleaned in chemical and subsequently dried.

For example, in a cleaning treatment of a manufacturing process for a semiconductor device, such as LSI etc., various cleaning apparatuses are employed for removing contaminants on the surfaces of the semiconductor wafers, such as particles, organic contaminants, metallic impurities and so on, and for etching the surface of the wafer. Note, in this specification, the semiconductor wafer(s) will be called the wafer(s) for short, hereinafter. Above all, a cleaning apparatus of "wet" type comes into wide use on the grounds that the above contaminants can be removed effectively, etching can be done and a batch processing can be accomplished to enhance the throughput in the cleaning process.

In such a wet type of cleaning apparatus, the wafers to be cleaned are subjected to a chemical cleaning process (e.g. ammonia treatment, hydrogen fluoride treatment, sulfuric acid treatment etc.), a washing cleaning process using pure water etc., and a drying process using isopropyl alcohol $[(CH_3)_2CHOH]$ or the like. Note, the isopropyl alcohol will be referred the IPA, hereinafter. Further, the cleaning apparatus is so constructed to supply the chemicals, the pure water and the IPA to processing baths in processing order and a drying room, respectively. Thus, with the above arrangement, a batch processing method where the wafers in blocks of e.g. 50 sheets are successively immersed in the processing baths and dried in the drying room, comes into wide use.

However, the provision of the processing baths and the drying room for each process causes the apparatus to be large-sized undesirably. In addition, because of a lot of opportunities for transporting the wafers in the apparatus, in other words, being exposed to atmosphere, there is a great possibility of the particles sticking to the wafers.

Therefore, in e.g. Japanese Unexamined Patent Publication (kokai) No. 64-81230 and the same No. 6-326073 etc., there are proposed cleaning apparatuses in each of which the processing baths and the drying room are formed in one body, so that the above-mentioned chemical process and drying process are carried out in one chamber. FIG. 1 shows one example of the cleaning apparatuses in the publications, representatively.

The shown cleaning apparatus comprises a chamber 200 and chemical (liquid) 202 stored in a lower portion 201 of the chamber 200. In processing, a wafer W is firstly immersed in the chemical 202. Thereafter, the wafer W is pulled up from the chemical 202 and then subjected to the drying process using the IPA etc. at an upper portion 203 of the chamber 200.

Meanwhile, as described in the above publications Nos. 64-81230 and 6-326073, it is general in such a drying process using the IPA to promote an interchange of the IPA with water by using treatment steam, which has been obtained by heating and boiling and the IPA, while heating an interior of the chamber by a heater or the like, thereby to carry out the drying process quickly.

In the above-mentioned drying process while heating, however, there is the possibility that not only interchange of the IPA with the water but a reaction between the water and silicon on a wafer surface of the wafer are also promoted to oxidize the wafer surface, so that the inferior wafer having water marks is produced unfortunately.

SUMMARY OF THE INVENTION

Accordingly, it is therefore an object of the present invention to provide a cleaning apparatus and a cleaning method by which it is possible to prevent an occurrence of water marks on a surface of a object to be processed to the utmost.

It is an additional object of the present invention to provide a cleaning apparatus and a cleaning method, both of which are not adversely affected by chemical treatments during the drying process.

It is the other object of the present invention to provide a cleaning apparatus and a cleaning method, both of which exhibit the high freedom of the design thereby to allow the cleaning process to be optimized and the apparatus to be miniaturized furthermore.

It is the other object of the present invention to provide a cleaning apparatus and a cleaning method by which it is possible to execute the drying process more effectively.

It is the other object of the present invention to provide a cleaning apparatus and a cleaning method, wherein processing baths and a drying section are separated from each other thereby to prevent mist of processing liquid etc. from entering into a drying room, whereby a stable drying performance can be realized.

As a first feature of the present invention, the above-mentioned objects described above can be accomplished by a cleaning apparatus comprising:

rinsing means for rinsing an object to be processed by using rinsing liquid; and drying means for drying the object rinsed by the rinsing means, while cooling the object.

Further, a second feature of the present resides in a cleaning apparatus comprising:

rinsing means for rinsing an object to be processed by using rinsing liquid;

blowing means for blowing cooled gas obtained by mixing organic solvent with inert gas, against the object rinsed by the rinsing means;

drying means for drying the object by blowing cooled gas containing inert gas, against the object; and normalizing means for normalizing a temperature of the object by blowing gas of a normal temperature containing inert gas, against the object dried by the drying means.

A third feature of the present resides in a method of cleaning a object to be processed, the method comprising the steps of:

rinsing a object to be processed by using rinsing liquid; and drying the object while cooling it.

A fourth feature of the present resides in a method of cleaning a substrate to be processed, the method comprising the steps of:

rinsing the object by using rinsing liquid;

blowing cooled gas obtained by mixing organic solvent with inert gas, against the object rinsed;

drying the object by blowing cooled gas containing inert gas, against the object; and normalizing a temperature of the object by blowing gas of normal temperature containing inert gas, against the object dried by the cooled gas.

A fifth feature of the present resides in a cleaning apparatus for cleaning a object to be processed, the apparatus comprising:
- a processing bath for storing processing liquid in which the object is immersed;
- a drying chamber arranged above the processing bath and provided with an opening which is disposed between a body of the drying chamber and the processing bath and through which the object is transported, the opening being adapted so as to open and close;
- transporting means for transporting the object between the processing bath and the drying chamber through the opening; and
- first blowing means arranged in the drying chamber, for blowing gas containing cooled inert gas against the object.

A sixth feature of the present resides in the cleaning apparatus in accordance with the fifth feature, further comprising:
- second blowing means arranged between the processing bath and the drying chamber, for blowing the gas containing the cooled inert gas against the object on transportation from the processing bath to the drying chamber.

A seventh feature of the present resides in the cleaning apparatus in accordance with the fifth feature, further comprising
- cooling means arranged in the drying chamber, for cooling the object.

An eighth feature of the present resides in the cleaning apparatus in accordance with the fifth feature,
wherein the first blowing means blows the object the gas containing the cooled inert gas from an upper section of the drying chamber in a downward flowing manner; and further comprising:
- discharging means for discharging the gas containing the inert gas, which has been blown out from the first blowing means, from a lower section of the drying chamber;
- wherein the discharging means is provided with an exhaust port through which the gas is discharged from the drying chamber.

A ninth feature of the present resides in the cleaning apparatus in accordance with the eighth feature, further comprising rectifying means communicating with the exhaust port and having a plurality of intake ports for introducing the gas containing the inert gas, which has been blown out from the first blowing means, through a lower section of the drying chamber.

A tenth feature of the present resides in the cleaning apparatus in accordance with the fifth feature, wherein the processing liquid stored in the processing bath is a deaerated rinse.

An eleventh feature of the present resides in the cleaning apparatus in accordance with the fifth feature, wherein the processing liquid stored in the processing bath is a cooled rinse.

A twelfth feature of the present resides in a cleaning apparatus for cleaning a object to be processed, the apparatus comprising:
- a processing bath for storing processing liquid in which the object is immersed;
- a drying chamber arranged above the processing bath and provided with an opening which is disposed between a body of the drying chamber and the processing bath and through which the object is transported, the opening being capable of closing;
- transporting means for transporting the object between the processing bath and the drying chamber through the opening;
- blowing means for blowing cooled gas of a mixture of an organic solvent and inert gas against the object;
- drying means for drying the object by blowing cooled gas containing inert gas against the object; and
- normalizing means for normalizing a temperature of the object by blowing gas of normal temperature containing inert gas against the object dried by the drying means.

A thirteenth feature of the present resides in a cleaning method of cleaning a object to be processed, the cleaning method comprising the steps of:
(a) immersing the object into a processing bath for storing processing liquid;
(b) transporting the object from the processing bath to a drying chamber arranged above the processing bath through an opening which is capable of opening and closing;
(c) closing the opening after the object has been transported to the drying chamber; and
(d) blowing gas containing cooled inert gas against the object.

A fourteenth feature of the present resides in a cleaning method of cleaning a object to be processed, the cleaning method comprising the steps of:
(a) immersing the object into a processing bath for storing processing liquid;
(b) transporting the object from the processing bath to a drying chamber arranged above the processing bath through an opening which is capable of opening and closing;
(c) closing the opening after the object has been transported to the drying chamber;
(d) blowing cooled gas of a mixture of an organic solvent and inert gas against the object;
(e) drying the object by blowing cooled gas containing inert gas against the object; and
(f) normalizing a temperature of the object by blowing gas of normal temperature containing inert gas against the object dried by the inert gas.

A fifteenth feature of the present resides in the cleaning method in accordance with the thirteenth or fourteenth feature, wherein, prior to the step of (b), the drying chamber has been filled up with a cooled and rarefied atmosphere of an organic solvent.

According to the first and third features of the invention, the object rinsed by the rinsing liquid is then dried in a cooling system. Thus, for example, in case of a wafer as the object to be processed, a wafer surface becomes difficult to be oxidized since a reaction between water ($H_2O$) and silicon (Si) element in the wafer surface is inactivated. Therefore, it is possible to restrict an occurrence of water marks on the wafer surface to the utmost.

According to the second and fourth features of the invention, the object rinsed by the rinsing liquid is dried in a cooling system, too. Therefore, in case of the wafer as the object to be processed, the wafer surface becomes difficult to be oxidized since the reaction between water ($H_2O$) and silicon (Si) element in the wafer surface is inactivated. Therefore, it is possible to restrict the occurrence of water marks on the wafer surface to the utmost. In addition, since the cleaning apparatus and method are constituted together so as to blow off the rinsing liquid by the cooled gas containing the inert gas after the rinsing liquid has been replaced with the above mentioned cooled mixed gas, it becomes difficult that the wafer surface is oxidized due to the inactivated reaction between water ($H_2O$) and silicon (Si) element in the wafer surface. Therefore, it is possible to further restrict the occurrence of water marks on the wafer surface, because the gas containing the inert gas has a function to restrict the oxidation. Moreover, since the gas of the normal temperature containing the inert gas is blown against the dried object in order to normalize a temperature of the object, it is possible to prevent moisture from sticking on a surface of the object.

According to the fifth and thirteenth features of the invention, the object rinsed by the rinsing liquid is dried by blowing the cooled gas containing the inert gas. Thus, for example, in case of the wafer as the object to be processed, the wafer surface becomes difficult to be oxidized since the reaction between water ($H_2O$) and silicon (Si) element in the wafer surface is inactivated. Therefore, it is possible to restrict the occurrence of water marks on the wafer surface to the utmost. Furthermore, with the arrangement where the drying chamber and the processing bath are separated from each other up and down and a space of the drying chamber can be insulated from a space of the processing bath through the closing opening object has no possibility to receive a bad influence from the chemical treatment during the drying process. Further, owing to an enhanced degree of freedom in the process design, it is possible to optimize the cleaning process and miniaturize the cleaning apparatus furthermore, whereby the drying process can be accomplished more effectively.

According to the sixth feature of the invention, since the second blowing means, which blows the gas containing cooled inert gas against the object on transportation from the processing bath to the drying chamber, serves to assist the dry process for the object, it can be carried out more effectively. Additionally, owing to the cooling operation with the cooled gas containing the inert gas, the wafer surface becomes difficult to be oxidized, so that it is possible to restrict the occurrence of water marks on the wafer surface to the utmost.

According to the seventh feature of the invention, as it is possible to lower a temperature of the interior of the drying chamber, the wafer surface becomes difficult to be oxidized thereby to restrict the occurrence of water marks on the wafer surface to the utmost.

According to the eighth feature of the invention, since the gas containing the inert gas flowing downward allows the processing liquid to be blown off the surface of the object, it is possible to carry out the drying process more effectively.

According to the ninth feature of the invention, since the rectifying means allows the gas containing the inert gas flowing downward to flow against the object uniformly, it is possible to carry out the drying process more effectively.

According to the tenth feature of the invention, the processing liquid stored in the processing bath is the deaerated rinse. Therefore, providing that the object is made of silicon element, it is possible to prevent the surface of the object from being oxidized.

According to the eleventh feature of the invention, since the processing liquid stored in the processing bath is the cooled rinse, it is possible to restrict the occurrence of water marks to the utmost and carry out the drying process effectively.

According to the twelfth and fourteenth features of the invention, the object rinsed by the rinsing liquid is dried by blowing the cooled gas containing the inert gas. For example, in case of the wafer as the object to be processed, the wafer surface becomes difficult to be oxidized since the reaction between water ($H_2O$) and silicon (Si) element in the wafer surface is inactivated. Therefore, it is possible to restrict the occurrence of water marks on the wafer surface to the utmost. In addition, since the cleaning apparatus and method are constituted together so as to blow off the rinsing liquid by the cooled gas containing the inert gas after the rinsing liquid has been replaced with the above mentioned cooled mixed gas, it becomes difficult that the wafer surface is oxidized due to the inactivated reaction between water ($H_2O$) and silicon (Si) element in the wafer surface. Therefore, it is possible to further restrict the occurrence of water marks on the wafer surface. Moreover, since the gas of the normal temperature containing the inert gas is blown against the dried object in order to normalize a temperature of the object, it is possible to prevent frost from sticking on a surface of the object. Furthermore, since the arrangement where the drying chamber and the processing bath are separated from each other up and down while a space of the drying chamber can be insulated from a space of the processing bath through the closing opening, the object has no possibility to receive a bad influenced from the chemical treatment during the drying process. Further, since the forthcoming process in the next processing bath can be prepared while the drying process is executed, it is possible to improve throughput of the cleaning apparatus. Since the arrangement allows the drying chamber and the processing bath to be designed under respective conditions independent of each other, it is possible to optimize the cleaning process and further miniaturize the cleaning apparatus because of the enhanced degree of freedom in the process design. Moreover, since the cleaning apparatus is constructed so as to blow off the processing liquid on the surface of the object by blowing the gas containing the cooled inert gas, it is possible to carry out the drying process more effectively. In addition, since the space for drying the object to be processed is defined apart from the space for the processing bath, it is possible to decrease the former space, thereby realizing the effective drying process.

According to the fifteenth feature of the invention, since the drying chamber has been already fulfilled up with thin atmosphere of cooled organic solvent before the object is transported to the drying chamber, it is possible to execute the drying process effectively. Moreover, since the above solvent is composed of thin vapor, there is no possibility of condensation of the solvent.

The above and other features and advantages of this invention will become apparent, and the invention itself will best be understood, from a study of the following description and appended claims, with reference had to the attached drawings showing a preferred embodiment of the invention.

BRIEF DESCRIPTION OF THE DRAWINGS

FIG. 5 is another longitudinal cross sectional side view of the cleaning unit of FIG. 4;

FIG. 10 is a perspective view showing a wafer guide of the cleaning unit of FIG. 4;

FIG. 11 is a perspective view showing a nozzle and a discharging port of the cleaning unit of FIG. 4;

FIG. 12 is a view for explanation of an operation of rectifying plates of the cleaning unit of FIG. 4;

FIG. 16 is a schematic view showing the operation of the cleaning unit of FIG. 4, corresponding to a step 1203 of FIG. 13;

FIG. 17 is a schematic view showing the operation of the cleaning unit of FIG. 4, corresponding to a step 1204 of FIG. 13;

FIG. 22 is a schematic view showing the operation of the cleaning unit of FIG. 4, corresponding to a step 1211 of FIG. 13;

FIG. 23 is a schematic view showing the operations of the cleaning unit of FIG. 4, corresponding to steps 1212 to 1214 of FIG. 13;

FIG. 24 is a schematic view showing the operation of the cleaning unit of FIG. 4, corresponding to a step 1215 of FIG. 13;

FIG. 25 is a schematic view showing the operation of the cleaning unit of FIG. 4, corresponding to a step 1216 of FIG. 13.

DESCRIPTION OF THE PREFERRED EMBODIMENT

One embodiment of the present invention will be described with reference to drawings.

Figure 1:
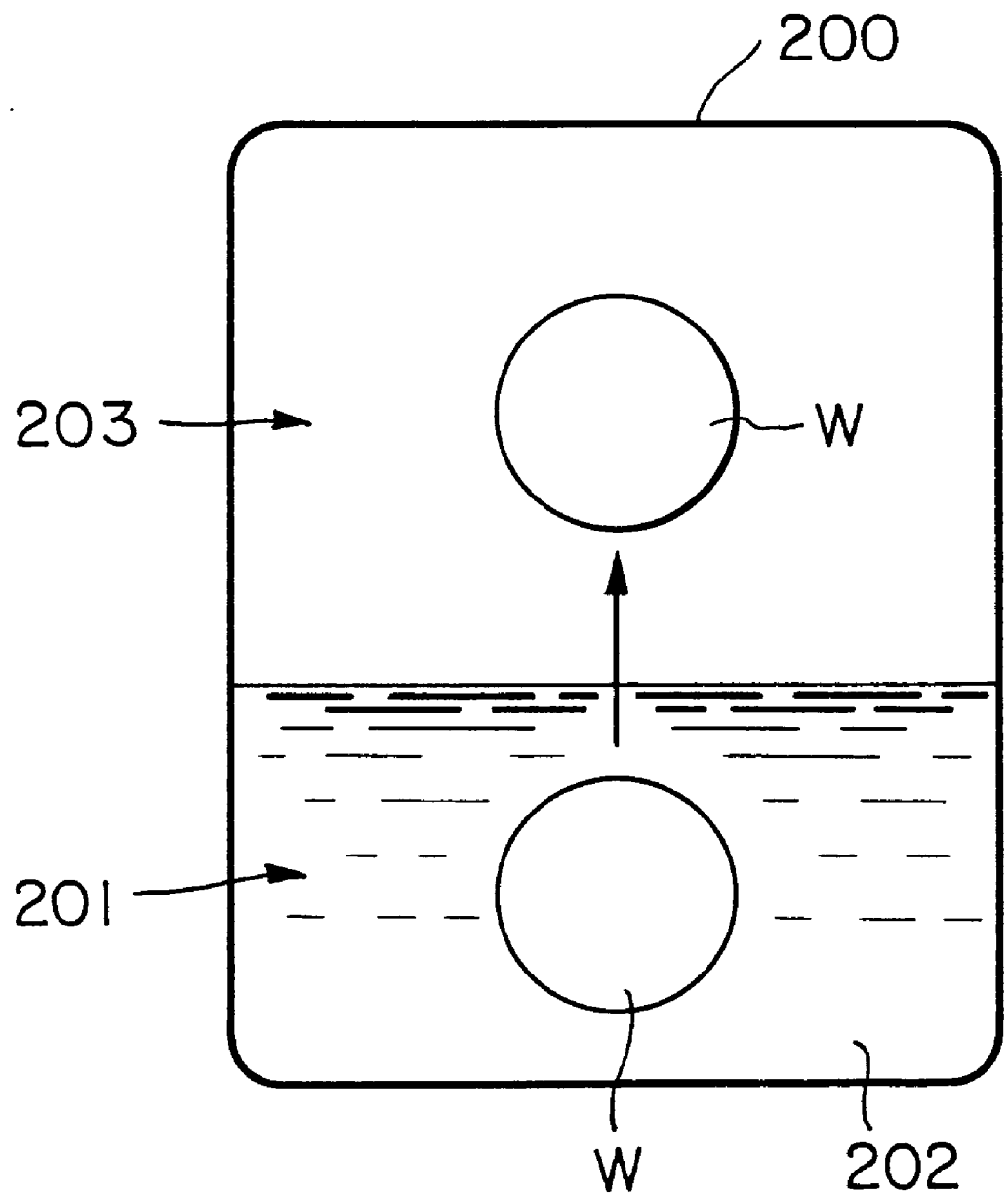
FIG. 1 is a schematic view of a conventional cleaning apparatus.
Figure 2:
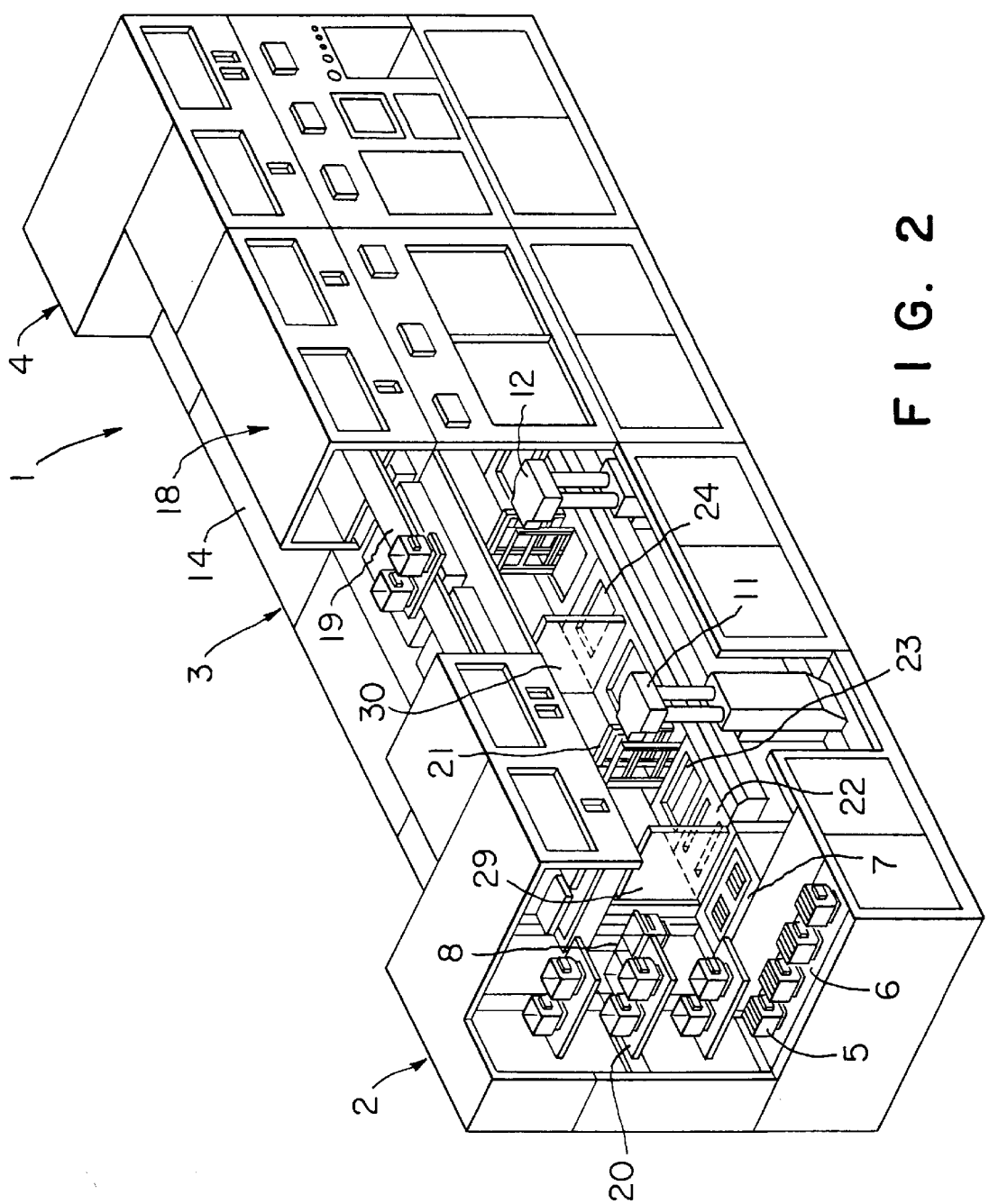
FIG. 2 is a cleaning apparatus for semiconductor wafers, in accordance with one embodiment of the present invention.
Figure 3:
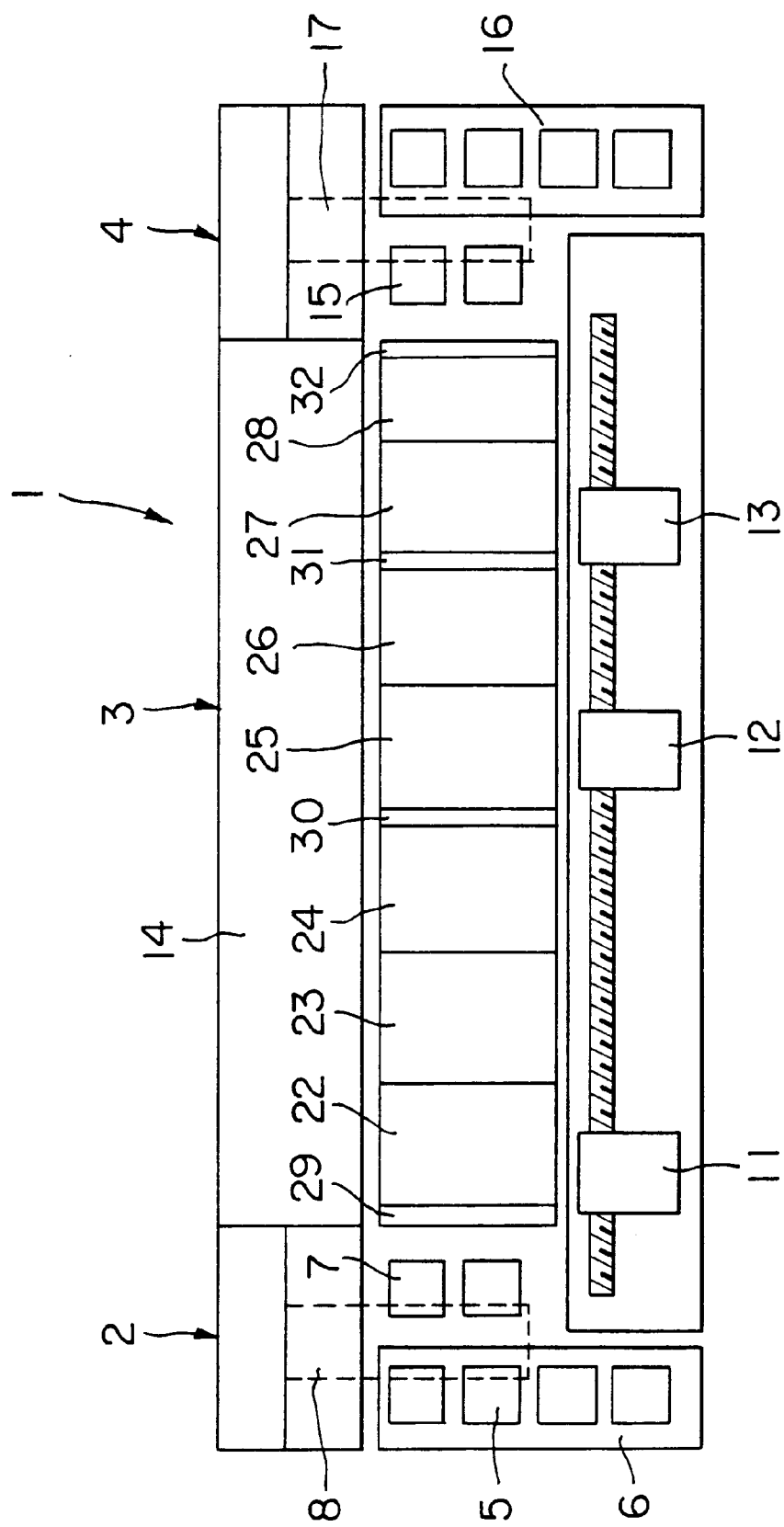
FIG. 3 is a plan view of the cleaning apparatus of FIG. 2.

First of all, we now describe a cleaning apparatus for cleaning semiconductor wafers, as an example to which the invention is applied. Note, through the description, the semiconductor wafer(s) will be also referred as "wafer(s)", hereinafter. As shown in FIGS. 2 and 3, the whole cleaning apparatus 1 comprises a loading section 2 for accommodating the wafers before cleaning in blocks of carriers, a cleaning section 3 for cleaning the wafers, and an unloading section 4 for picking up the wafers after cleaning and drying in the section 3 into the carriers C every predetermined number of blocks of cassettes. Thus, the cleaning apparatus 1 of the embodiment is constituted by three processing zones.

Arranged in the loading section 2 are a stand-by part 6 which causes carriers 5 having a predetermined number (e.g. twenty-five sheets) of precleaning wafers accommodated therein to stand by and a loader part 7 which carries out a picking-up operation of the wafers from the carriers 5, an aligning operation of respective orientation flats of the wafers, and a counting operation for the number of wafers. Further, the loading section 2 is provided with a transfer arm 8 which transports the carriers 5, which have been loaded from the outside by a transporting robot etc., to the stand-by part 6 and also between the stand-by part 6 and the loader part 7.

In the cleaning section 3, three wafer transfer units 11, 12, 13 are arranged on the front side (this side in FIG. 2) of the section 3, while a piping area 14 is defined on the back side of the section 3 through partition walls, for housing various tanks for reserving processing liquids, such as chemicals, and various pipes.

On the other hand, the unloading section 4 includes an unloader part 15 for accommodating the wafers cleaned in the cleaning section 3 in the carriers 5, a stand-by part 16 for causing the carriers 5 with the wafers to stand by, and a transfer arm 17 for transporting the carriers 5 between the unloader part 16 and the stand-by part 17.

Note, the cleaning apparatus 1 further includes a carrier transfer section 18 which transports the carriers 5 emptied in the loading section 2. The carrier transfer section 18 is equipped with a carrier conveyer 19 arranged above the cleaning section 3, a carrier stock 20 for receiving the emptied carriers 5 from the loader part 7 of the loading section 2 by means of the transfer arm 8 and stocking the carriers 5 with and without the wafers, and a not-shown delivering part which receives the emptied carriers 5 from the carrier conveyer 19 by means of the transfer arm 17 at the unloading section 4 and delivers the emptied carriers 5 to the unloader part 15.

The cleaning section 3 is provided with the following baths in order from the side of the loader part 7: a chuck cleaning/drying bath 22 for cleaning and drying a wafer chuck 21 of the wafer transfer unit 11; a chemical cleaning bath 23 for removing impurities, such as organic contaminants, metallic impurities particles or the like, on the surface of the wafer by using the chemicals, such as ammonium hydrogen peroxide ($NH_4OH/H_2O_2/H_2O$); a wash cleaning bath 24 for cleaning the wafers cleaned in the bath 23 by e.g. pure water; a chemical cleaning bath 25 for removing metallic contaminations on the wafers by a chemical, such as a mixture of $HCl/H_2O_2/H_2O$; a wash cleaning bath 26 for cleaning the wafers cleaned in the bath 25 by e.g. pure water; and a cleaning unit 27 of the invention for removing an oxide on the wafers by a chemical (e.g. a mixture of $HF/H_2O$), cleaning the washed wafers by the rinse (e.g. pure water) and drying the cleaned wafers; and a chuck cleaning and drying bath 28 for cleaning and drying not-shown wafer chucks of the wafer transfer unit 13.

Note, partition plates 29, 30, 31, 32 are interposed between the loader part 7 and the chuck cleaning/drying bath 22, between the wash cleaning bath 24 and the chemical cleaning bath 25, between the wash cleaning bath 26 and the cleaning unit 27, and between the chuck cleaning and drying bath 28 and the unloader part 15, respectively. These partition plates 29, 30, 31, 32 are adapted so as to open upward and shut downward in receiving and delivering the wafers by driving mechanisms which are not shown in the figures. Owing to the provision of the partition plates 29 30, 31, 32, it is possible to prevent atmosphere of (vapor's) the chemicals from diffusing into the adjoining spaces.

We now describe the structure of the cleaning unit 27 with reference to FIGS. 4 to 12. The cleaning unit 27 includes a cleaning bath 41 as a processing bath reserving the processing liquids of chemicals (e.g. mixture of $HF/H_2O$) and the rinse (e.g. pure water) and immersing the wafers to be processed in the liquids, and a cylindrical drying chamber 42 arranged above the cleaning bath 41 for drying the wafers W transported from the cleaning bath 41.

The cleaning bath 41 accommodates a wafer guide 43 and e.g. fifty sheets of wafers W carried by the wafer guide 43. Further, the cleaning bath 41 is provided, on both sides of a bottom thereof, with nozzles 44, 45 for ejecting the processing liquid for the wafers W accommodated therein. The nozzles 44, 45, may be constituted by pipes each of which has respective injection orifices formed at each interval equal to a distance between the adjoining wafers W along the direction of the wafers' arrangement. Into the nozzles 44, 45, either one of the chemical (e.g. mixture of $HF/H_2O$) and the rinse such as cooled pure water (DIW: deionized water) is supplied from the piping area 14 shown in FIGS. 2 and 3 by a switching operation of a switching valve 46. The switching operation of the switching valve 46 is controlled by a not-shown controller at predetermined timing. Note, in order to prevent the oxidation of the wafers W, it is preferable to use the deaerated DIW as the rinse.

Additionally, in the circumference of the cleaning bath 41, a collect bath 47 is provided for collecting the processing liquid overflowing the cleaning bath 41. The processing liquid collected by the collect bath 47 is adapted so as to circulate in the nozzles 44, 45 through a switching valve 48, a pump 49, a filter 50 and a switching valve 51. In the switching valve 48, it is set whether to circulate the processing liquid collected by the collect bath 47 in the above-mentioned manner or to discharge the liquid. In the switching valve 51, it is set whether to circulate the processing liquid collected by the collect bath 47 or to supply the cooled DIW to the nozzles 44, 45, which has been cooled to the 0—a normal temperature (° C.) degree range, more preferably 5° C., by a cooler. Note, a damper 52 is disposed between the pump 49 and the filter 50. At the lowermost part of the cleaning bath 41, an exhaust port 53 is arranged to drain the processing liquid. In the switching valve 54, it is set whether to drain the processing liquid through the exhaust port 53 or not.

The drying chamber 42 is provided, on upper and lower parts thereof, with rectangular upper and lower openings 61, 62 for receiving and delivering the wafers W, respectively. A lid 63 is laid on the upper opening 61, while a slide door arrangement 64 is provided at the lower opening 62.

Figure 6:
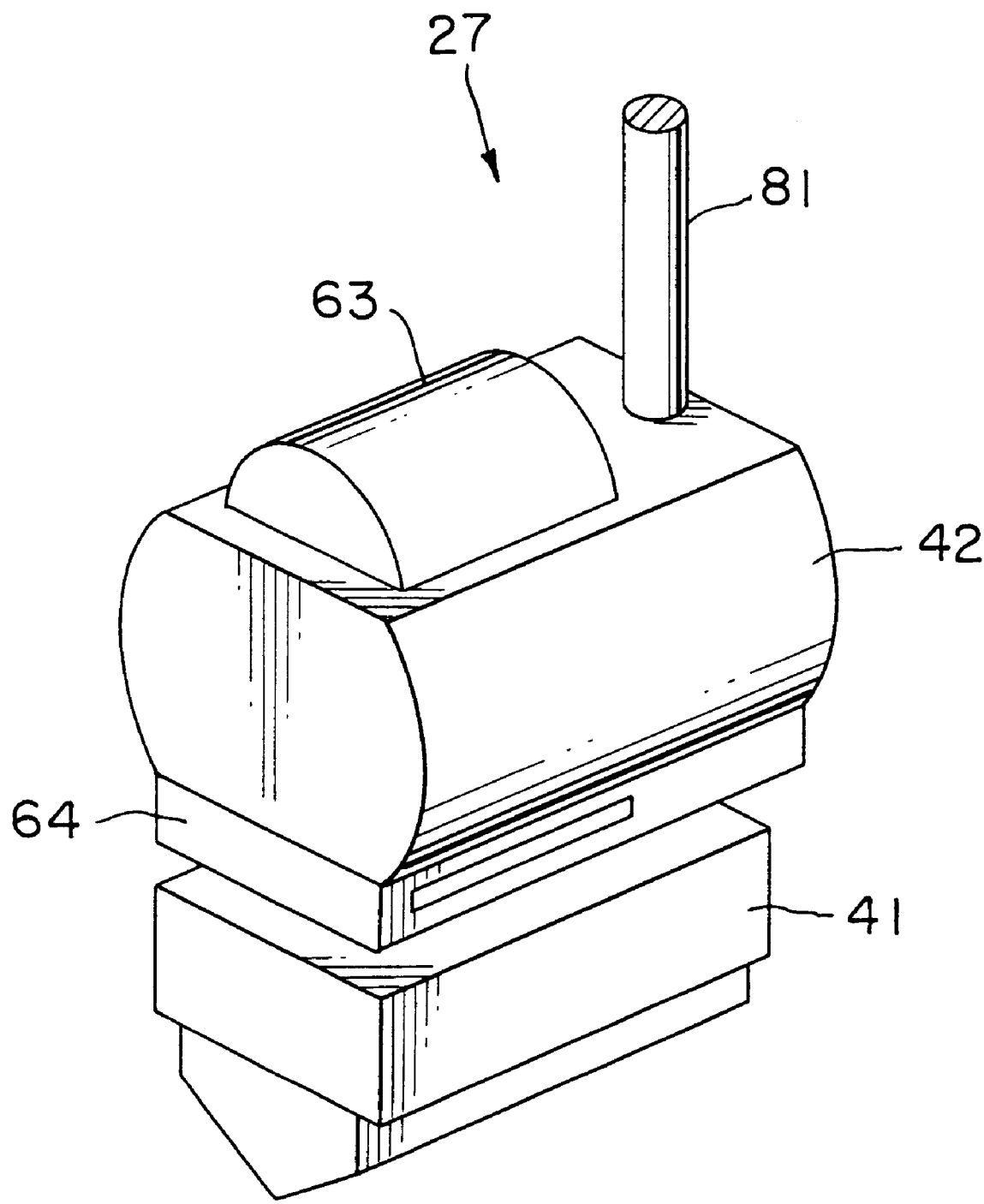
FIG. 6 is a perspective view of the cleaning unit of FIG. 4.
Figure 7:
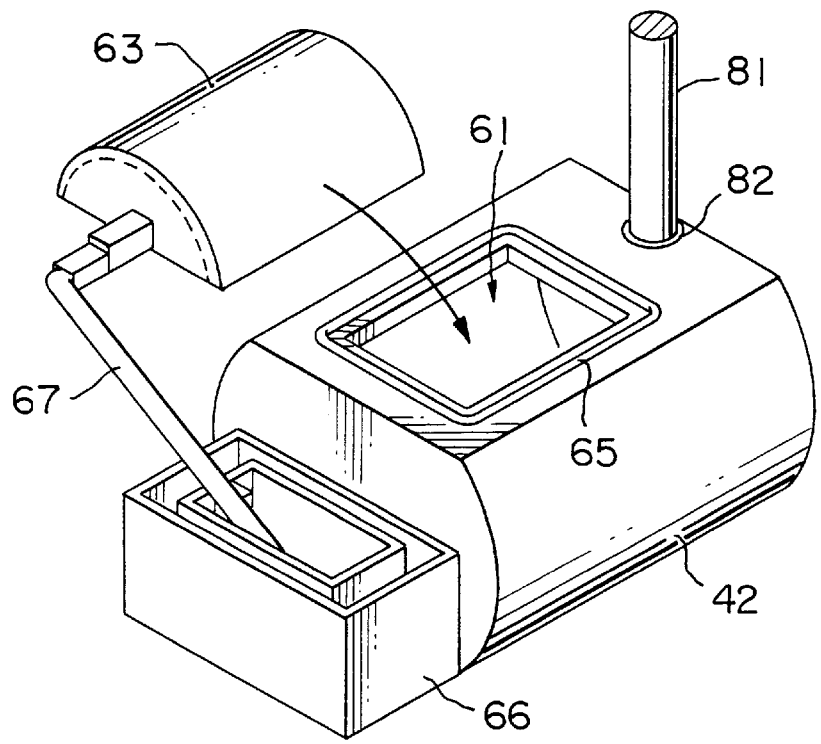
FIG. 7 is a perspective view showing the vicinity of an upper lid of the cleaning unit of FIG. 4.

The lid 63 is made of resin, such as PVC (polyvinyl chloride) and PP (polypropylene) etc., and shaped like a semi-cylinder at both of the interior and exterior, as shown in FIG. 6. Thus, such a formation of the lid 63 causes the interior of the drying chamber 42 closed by the lid 63 to be defined substantially cylindrically, while preventing a stream of nitrogen gas etc. blown against the wafers W from being-turbulent. Consequently, the nitrogen gas or the like can be blown against the respective wafers W uniformly. In addition, as shown in FIG. 7, an O-ring 65 is arranged around the periphery of the upper opening 61 to enhance the sealing capability of the chamber 41 when the upper opening 61 is closed by the lid 63.

Figure 8:
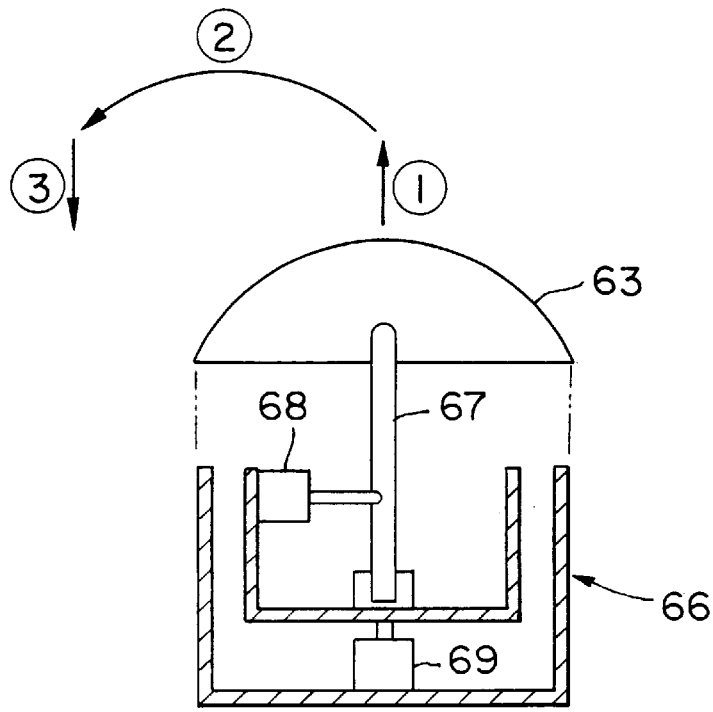
FIG. 8 is a view showing a schematic structure of a lid driving section of the cleaning unit of FIG. 4.

Arranged in the vicinity of the drying chamber 42 is a lid actuator 66 which drives to open and shut the lid 63. As shown in FIG. 8, the lid actuator 66 includes a cylinder 68 for rotating a pivot arm 67 having an end fixed to the lid 63, and another cylinder 69 for moving the lid 63 and these rotating arrangements (the cylinder 68, the arm 67) upward and downward. In operation for opening the lid 63, the lid actuator 66 firstly moves the lid 63 closing the upper opening 61 upward (see ① of FIG. 8). Subsequently, the lid actuator 66 further rotates the lid 63 to a position apart from the upper opening 61 (see ② of FIG. 8) and moves the lid 63 downward (see ③ of FIG. 8). In this way, the upper opening 51 is opened. On the contrary, when it is required to close the upper opening 61 by the lid 63, the above-mentioned operations will be executed in reverse order (i.e. ③→②→① of FIG. 8).

Figure 9:
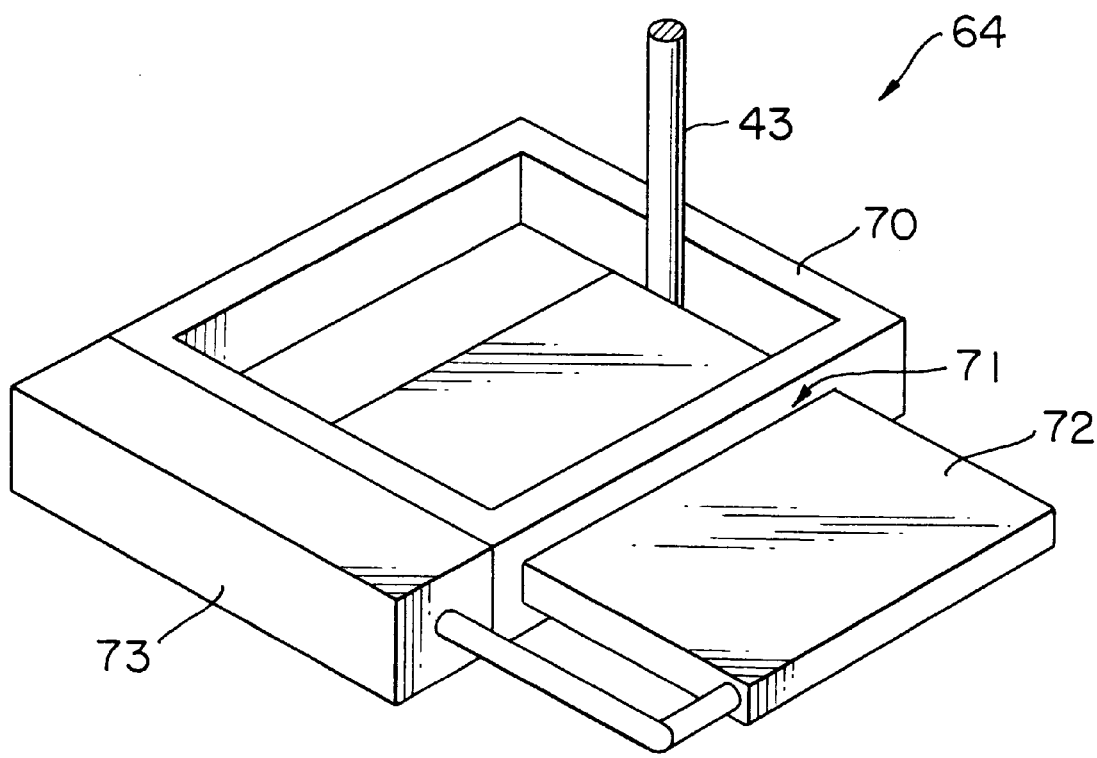
FIG. 9 is a perspective view showing a sliding door arrangement of the cleaning unit of FIG. 4.

As shown in FIG. 9, the slide door arrangement 64 comprises a rectangular flange 70 disposed between the cleaning bath 41 and the drying chamber 42, a slide door 72 inserted into an opening 71 formed in the flange 70 to open and close an interior of the flange 70, and a cylinder 73 for driving the slide door 72. Similar to the lid 63, the slide door 72 is made of resin, such as PVC (polyvinyl chloride) and PP (polypropylene) etc., and rectangular-shaped similarly to the lower opening 62.

As shown in FIG. 10, the wafer guide 43 is provided, at an lower end of a carrying member 74 thereof, with a wafer support 75 for supporting a plurality of wafers W (e.g. 50 sheets). The wafer support 75 consists of an intermediate supporting rod 76 and two lateral supporting rods 77, 78 arranged in parallel with each other on both sides of the rod 76. Respective ends of the rods 76, 77, 78 are fixed with a lower end of the carrying member 74, while the other ends of the rods 76, 77, 78 are secured to a fixing member 79. Each of the rods 76, 77, 78 has a plurality of retaining grooves 80, 80 . . . , 80 (e.g. fifty grooves) formed at predetermined intervals in the longitudinal direction. The wafer guide 43 is made of materials exhibiting superior characteristics in corrosion resistance, heat resistance and durability, for example, PEEK (polyether ether ketone), Qz (quartz) and so on.

A guide elevating rod 81 is fixed to an upper end of the wafer guide 43. As shown in FIGS. 5 and 6, the guide elevating rod 81 is adapted so as to move upward and downward, projecting to the outside through a hole 82 formed on the top of the drying chamber 42. The upper end of the guide elevating rod 81 is connected with a wafer-guide Z-axis mechanism 83 arranged behind the drying chamber 42. Since the wafer-guide Z-axis mechanism 83 operates to move the guide elevating rod 81 up and down, the wafers W carried by the wafer guide 43 are transported between the cleaning bath 41 and the drying chamber 42 through the lower opening 62. Further, as shown in FIG. 5, the wafer transfer unit 13 (see FIG. 3) is arranged in front of the cleaning unit 27. In operation, as shown in FIG. 10, a wafer chuck 84 provided on the wafer transfer unit 13 receives, for example, fifty sheets of wafers W from the neighboring wash cleaning bath 26 and delivers them to the wafer guide 43 in the drying chamber 42. Furthermore, the wafer chuck 84 receives, for example, fifty sheets of wafers W from the wafer guide 43 in the drying chamber 42 and delivers them to the unloader part 15 of the unloading section 4.

Figure 4:
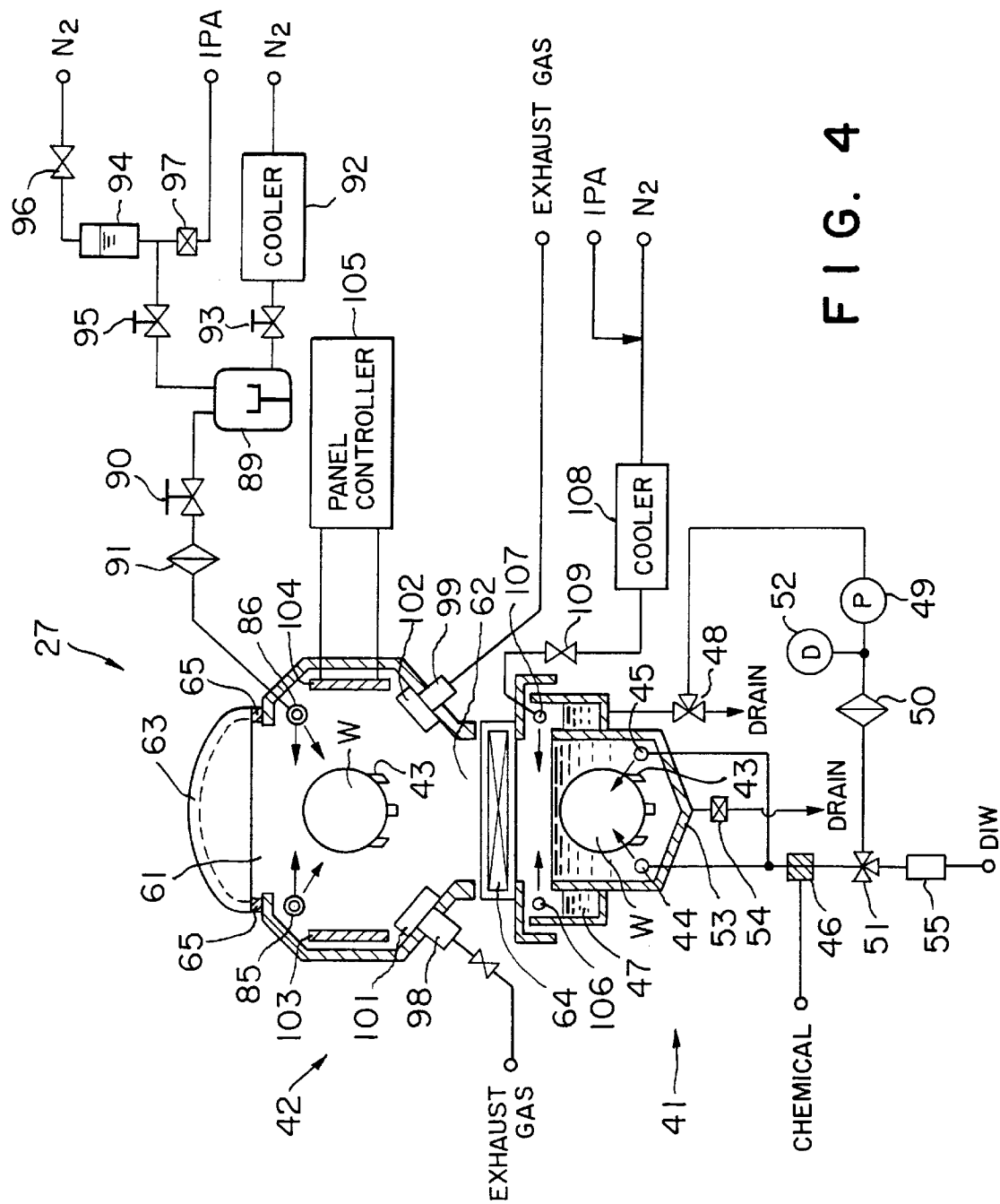
FIG. 4 is a longitudinal cross sectional view of a cleaning unit of the cleaning apparatus of FIG. 2.

As shown in FIGS. 4 and 11, on both sides of the upper part of the drying chamber 42, two nozzles 85, 86 are arranged so as to blow the cooled nitrogen gas etc. over the wafers W carried by the wafer guide 43 in a downward-flowing manner. The nozzles 85, 86 are constituted by pipes 88 having injection holes 87 formed at regular intervals each of which is identical to the distance between the adjoining wafers W in the direction of the wafers' arrangement. Supplied to the nozzles 85, 86 through an IPA evaporator 89, a control valve 90 and a filter 91 is the mixed gas of IPA and nitrogen, which has been cooled to 0— the normal temperature (° C.) degree range, more preferably 5° C. Into the IPA evaporator 89, the cooled nitrogen is supplied through a nitrogen-cooler 92 and a control valve 93, while the IPA is also supplied from an IPA tank 94 through a control valve 95. Similarly, the nitrogen is supplied to the IPA tank 94 through a control valve 96, while the IPA is also supplied to the IPA tank 94 through a control valve 97. Respective activations of the control valves 90, 93, 95, 96, 96, 97 are controlled by a controller which is not shown in the figures.

On the other hand, as shown in FIGS. 4 and 11, the drying chamber 42 is provided, on both sides of the lower part, with exhaust ports 98, 99 for discharging the nitrogen gas etc. blown out of the nozzles 85, 86. The exhaust ports 98, 99 are communicated with a not-shown exhaust pump. Also communicated with the exhaust ports 98, 99 are respective rectifying plates 101, 102 as rectifying means, which having a plurality of inlets 100, 100, . . . , 100 for sucking the nitrogen gas etc., which have been blown out of the nozzles 85, 86, through respective parts at the lower part of the drying chamber 42 uniformly. With the arrangement, as shown by dotted lines of FIG. 12, the nitrogen gas etc., which have been blown out of the injection holes 87 of the nozzles 85, 86, are flowing on the surfaces of the wafers W and subsequently sucked from the inlets 100 of the rectifying plates 101, 102. Thus, owing to the above-mentioned flow of the nitrogen gas etc., it is possible to prevent the occurrence of turbulence in o the flows of the nitrogen gas etc. Note, the drying chamber 42 is also provided, at the lower part, with a drain port (not shown) for discharging the liquids.

Again in FIG. 4, a pair of panel coolers 103, 104 are arranged on both sides of a center of the drying chamber 42. These panel coolers 103, 104 are electrically connected to a panel controller 105 for controlling the temperature in the chamber 42. The temperature of the chamber 42 is maintained in the range of 0— the normal temperature (° C.), more preferably 5° C.

Provided between the cleaning bath 41 and the drying chamber 42, for example, on both sides of a space above the surface of the bath 41 are nozzles 106, 107 which blow the mixed gas of the IPA and the nitrogen gas against the wafers W during transporting from the bath 41 to the chamber 42. The structures of the nozzles 106, 107 are substantially similar to those of the above-mentioned nozzles 85, 86. Supplied to the nozzles 106, 107 through a cooler 108 and a control valve 109 is the mixed gas of IPA and nitrogen, which has been cooled to the 0— the normal temperature (° C.) degree range, more preferably 5° C., too.

Figure 13:
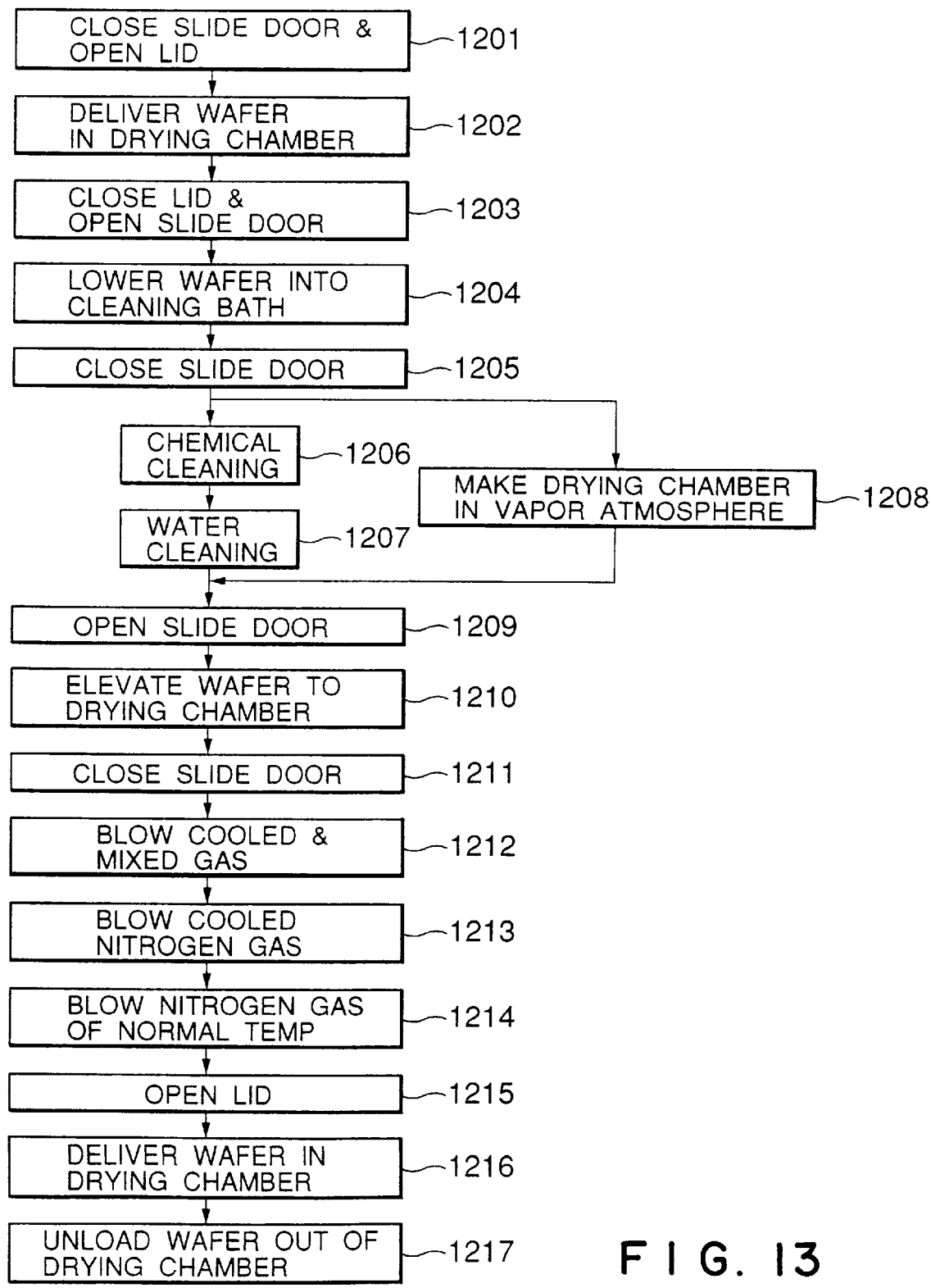
FIG. 13 is a flow chart of an operation of the cleaning unit of FIG. 4.

We now describe an operation of the cleaning apparatus 27 constructed above, in accordance with a flow chart of FIG. 13. Note, the following operational control is executed by a not-shown controller.

Figure 14:
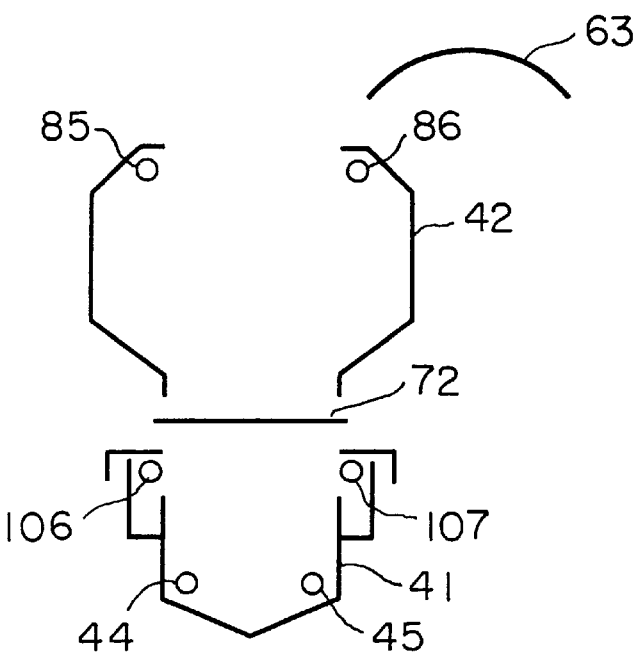
FIG. 14 is a schematic view showing the operation of the cleaning unit of FIG. 4, corresponding to a step 1201 of FIG. 13.
Figure 15:
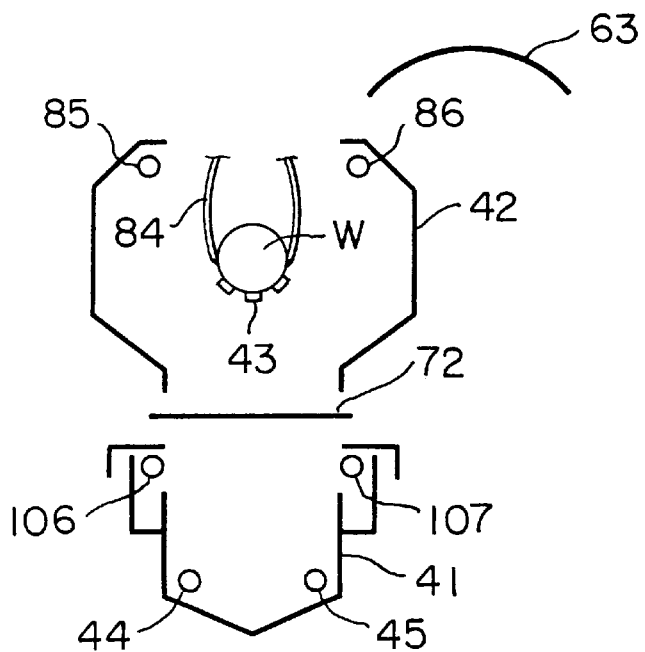
FIG. 15 is a schematic view showing the operation of the cleaning unit of FIG. 4, corresponding to a step 1202 of FIG. 13.

First of all, upon closing the slide door 72 at the bottom of the drying chamber 42, the lid 63 on the top of the chamber 42 is opened (see step 1201, FIG. 14). Next, the wafer chuck 84 is lowered into the chamber 42, and the wafers W are delivered to the wafer guide 43 in the chamber 42 (see step 1202, FIG. 15).

Figure 18:
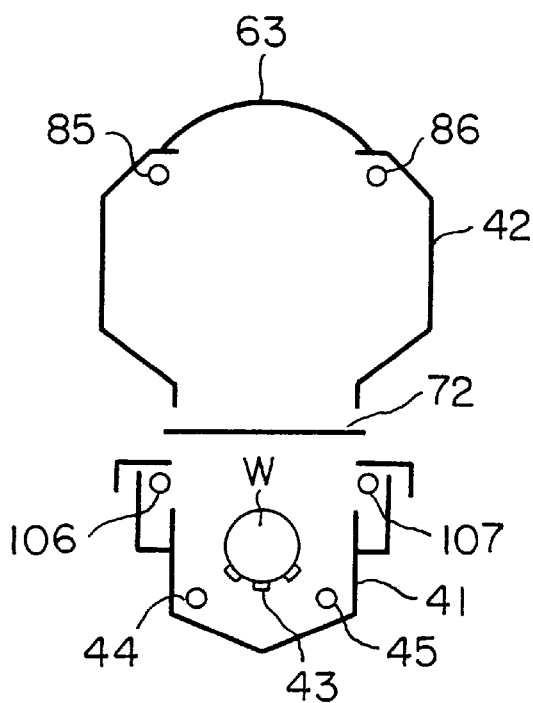
FIG. 18 is a schematic view showing the operation of the cleaning unit of FIG. 4, corresponding to a step 1205 of FIG. 13.

At sequent step 1203, it is executed to close the lid 63 on the top of the chamber 42 and open the slide door 72 at the bottom of the chamber 42 (see FIG. 16). Then, the wafer guide 43 carrying the wafers W is lowered to transfer them into the cleaning bath 41 (step 1204, FIG. 17) and the slide door 72 is closed in succession (step 1205, FIG. 18).

Figure 19:
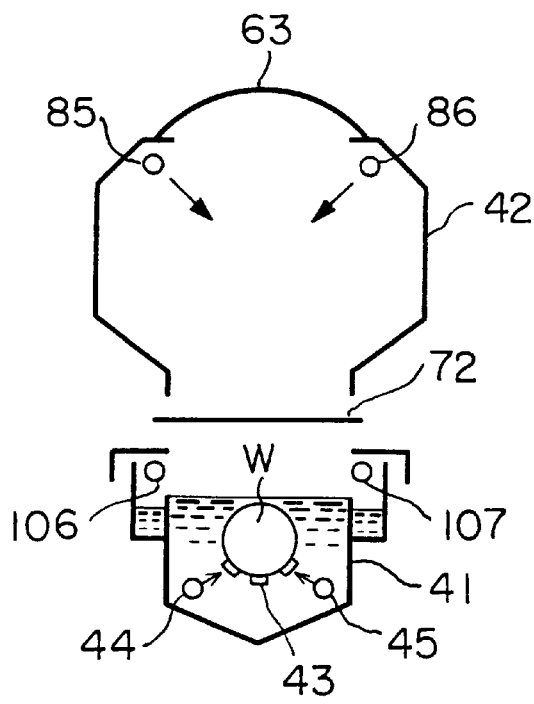
FIG. 19 is a schematic view showing the operations of the cleaning unit of FIG. 4, corresponding to steps 1206 to 1208 of FIG. 13.

Thereafter, in the cleaning bath 41, it is executed to inject the mixture of $HF/H_2O$ through the nozzles 44, 45 and subsequently immerse the wafers W into the mixture of $HF/H_2O$ for chemical cleaning (step 1206, FIG. 19). As a matter of course, the mixture of $HF/H_2O$ ejected from the nozzles 44, 45 forms a convection directing the wafers W in the cleaning bath 41 thereby to promote the chemical cleaning. Of course, this chemical liquid may be stored prior to the introduction of the wafers W into the cleaning bath 41. Next, the mixture of $HF/H_2O$ is discharged and thereafter, the cooled DIW is ejected from the nozzles 44, 45 to rinse the wafers W (step 1207, FIG. 19). As well as the mixture of $HF/H_2O$, the DIW ejected from the nozzles 44, 45 forms a convection directing the wafers W in the cleaning bath 41 thereby to promote the rinsing process. Note, in the modification, the supply of DIW may be started without discharging the mixture of $HF/H_2O$ so that the density of the mixture becomes to be thin gradually. On the other hand, while such a cleaning process is carried out, the cooled IPA is blown out from the nozzles 85, 86, so that the drying chamber 42 is filled up with an atmosphere of the rarefied IPA vapor (step 1208, FIG. 19).

Figure 20:
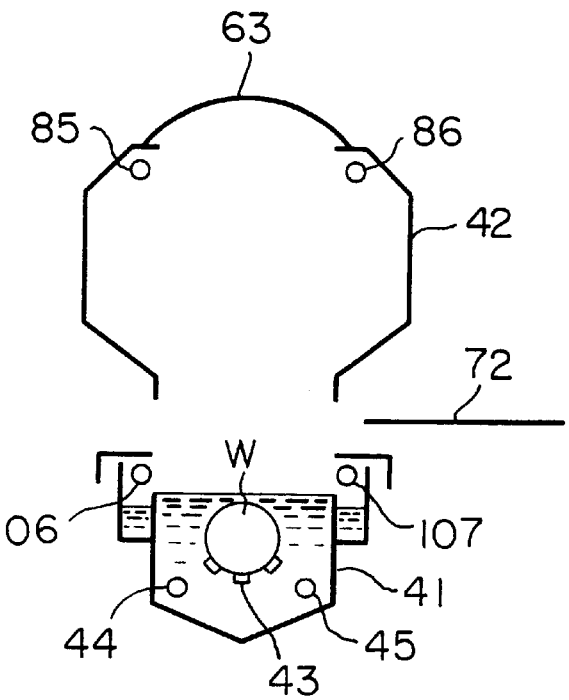
FIG. 20 is a schematic view showing the operation of the cleaning unit of FIG. 4, corresponding to a step 1209 of FIG. 13.
Figure 21:
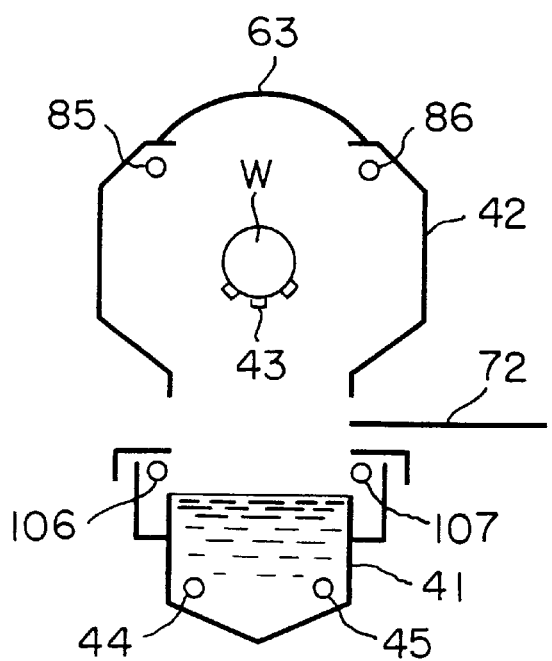
FIG. 21 is a schematic view showing the operation of the cleaning unit of FIG. 4, corresponding to a step 1210 of FIG. 13.

Next, at step 1209, it is executed to open the slide door 72 at the bottom of the drying chamber 42 (FIG. 20) and thereafter, the wafer guide 43 carrying the wafers W is elevated to transport them into the drying chamber 42 (step 1210, FIG. 21). During the transportation, the cooled nitrogen gas or the mixed gas of the nitrogen gas and the IPA is blown against the wafers W on transportation from the cleaning bath 41 to the drying chamber 42 by the nozzles 106, 107. Subsequently, upon closing the slide door 72 at the bottom of the drying chamber 42 (step 1211, FIG. 22), the nitrogen gas etc. is blown from the nozzles 85, 86 to the wafers W in the drying chamber 42 in the downward flowing manner (step 1212–1214, FIG. 23). In detail, at first, the mixed gas of the cooled IPA and the nitrogen gas is blown against the wafers W (step 1212). Next, the cooled nitrogen gas is blown against the wafers W (step 1213) and finally, the nitrogen gas of the normal temperature is blown against the wafers W (step 1214). It is noted that the process to blow the cooled nitrogen gas is executed under natural ventilation. Further, in the modification, the blowing process of the mixed gas (IPA+N2) at step 1212 may be executed prior to the transporting process of the wafers W into the drying chamber 42 at step 1210.

Figure 26:
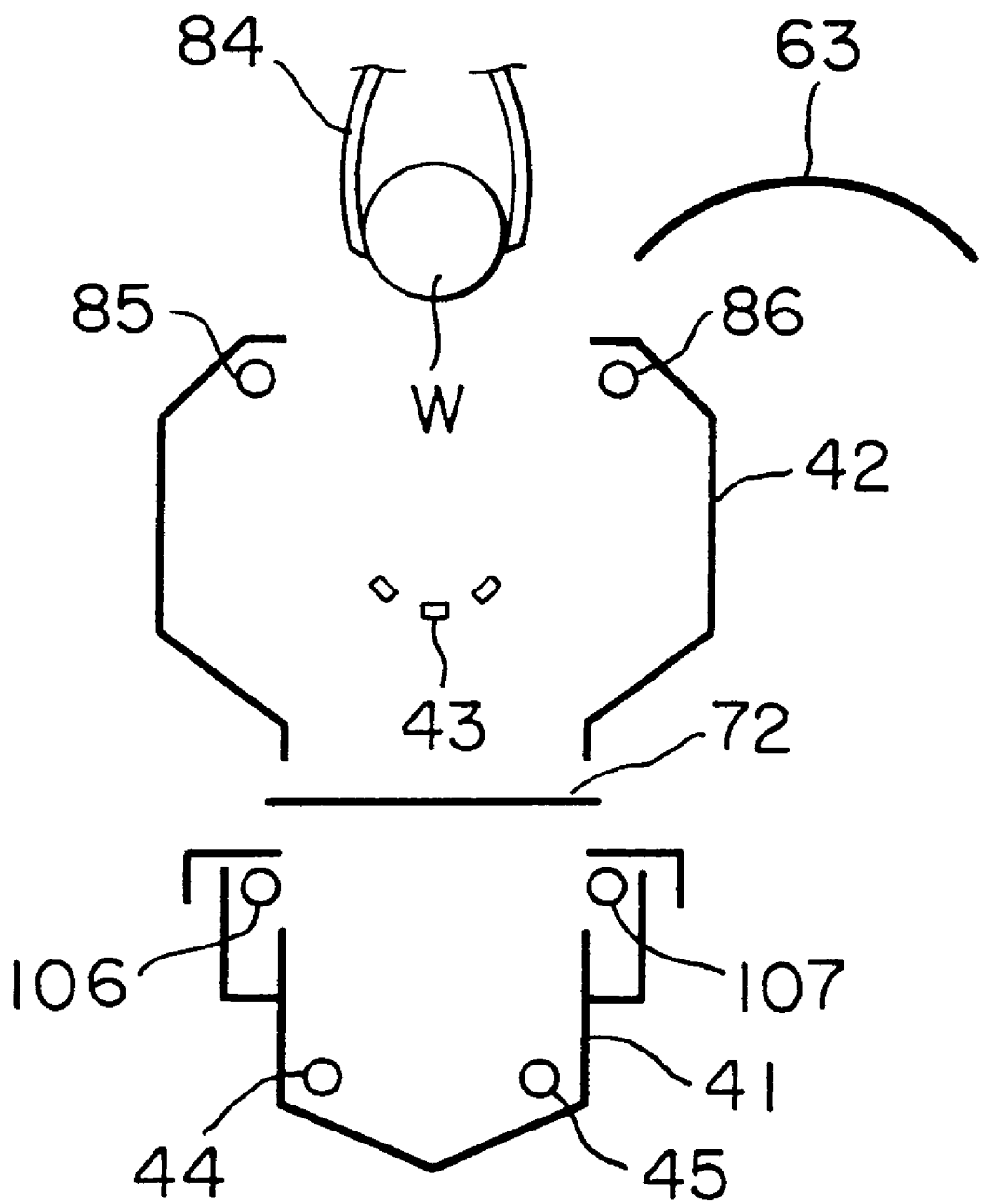
FIG. 26 is a schematic view showing the operation of the cleaning unit of FIG. 4, corresponding to a step 1217 of FIG. 13.

At sequent step 1215 (FIG. 24), it is executed to open the lid 63 on the top of the drying chamber 42 and thereafter, the wafer chuck 84 is lowered into the chamber 42 to receive the wafers W from the wafer guide 43 (step 1216, FIG. 25). Then, the wafer chuck 84 is elevated to unload the wafers W outside of the drying chamber (step 1217, FIG. 26).

In this way, according to the cleaning apparatus 27 of the embodiment, since the wafers W rinsed by the DIW at the drying chamber 42 are dried in the above-mentioned cooling system, the reaction between water ($H_2O$) and silicon (Si) elements in the wafer surfaces is inactivated, so that the respective wafer surface become difficult to be oxidized.

Consequently, it is possible to restrict the occurrence of water marks on the wafer surfaces to the utmost.

In addition, since the cleaning apparatus 27 is constituted in a manner that, after the DIW has been replaced with the cooled mixed gas composed of the IPA and the nitrogen gas to a certain extent, the DIW on the wafer surfaces is blown by the cooled nitrogen gas, the resulting inactivated reaction between water ($H_2O$) and silicon (Si) element in the wafer surfaces causes the wafer surfaces to be oxidized with difficulty. Therefore, it is possible to further restrict the occurrence of water marks on the wafer surfaces.

Moreover, since the nitrogen gas of the normal temperature is blown against the dried wafers W in order to normalize the temperature of the wafers W, it is possible to prevent frost from sticking on the wafer surfaces, further restricting the occurrence of water marks on the wafer surfaces.

Furthermore, according to the embodiment, since the drying chamber 42 and the cleaning bath 41 are separated from each other up and down and constructed so that the former space can be insulated from the latter space by the slide door 72 and the respective processes are carried out separately by the closing slide door 72, there is no possibility that the drying chamber 42 and the cleaning bath 41 mutually exert a bad influence due to the chemical etc.

Further, since it is possible to design the drying chamber 42 and the cleaning bath 41 under respective conditions independent of each other, it is possible to optimize the cleaning process and further miniaturize the cleaning apparatus 27 owing to the enhanced degree of freedom in the design. For instance, the drying chamber 42 may be provided with the panel coolers 103, 104 for cooling the inside of the chamber 42 in view of the drying process without any trouble. Or again, the atmosphere in the drying chamber 42 may be replaced with the IPA vapor while cleaning the wafers W in the cleaning bath 41 in view of the prompt drying process.

Further, since the drying chamber 42 can be miniaturized in comparison with that of the conventional cleaning apparatus where the processing bath and the drying chamber have been accommodated in one chamber, it is possible to carry out the drying process more effectively.

Now, it is noted that the present invention is not limited to the above-mentioned embodiment and various changes and modifications may be made within a scope of concept of the art.

For example, although the nitrogen gas is used as the inert gas of the above-mentioned embodiment, other inert gases, such as argon (Ar), helium (He) etc., may be may be used as a substitute of the nitrogen gas.

Although the IPA is employed as a water-soluble organic solvent having an function to decrease the surface tension of pure water with respect to the object to be processed in the embodiment, the IPA may be replaced with other organic solvents, for example, ketonic kinds (e.g. diethyl keton), ether kinds (e.g. methyl ether, ethyl ether), multicharged alcohol (e.g. ethylene glycol) or the like.

Although the chemical treatment using the mixture of $HF/H_2O$ and the rinsing and drying processes using the pure water are executed in the cleaning apparatus 27 in the above-mentioned embodiment, it should be understood that a cleaning apparatus for and a method of executing at least the drying process and one or more other processes will be included in the scope of the invention. For example, the chemical process using the mixture of $HF/H_2O$, the rinsing process using the pure water, the chemical process using the mixture of $NH_4OH/H_2O_2/H_2O$, and the chemical process using the mixture of $HCl/H_2O_2/H_2O$ etc. are applicable to the above other processes. Accordingly, of course, the cleaning apparatus of the invention may be constructed so as to carry out ,for example, the chemical process using the mixture of $NH_4OH/H_2O_2/H_2O$, the chemical process using the mixture of $HCl/H_2O_2/H_2O$, the chemical process using the mixture of $HF/H_2O$, the rinsing process using the pure water, and the drying process.

Although the above-mentioned embodiment is one example of the cleaning apparatus of the invention in association with a cleaning equipment having the processing baths in processing order, it is possible to use the present cleaning apparatus as a stand alone type apparatus. In this case, for example, it is also possible to construct the stand alone apparatus by connecting a transfer section having the loader part and unloader part with the present cleaning apparatus.

In addition, it will be understood that the object to be processed is not limited to the semi-conductor wafer of the embodiment, so that a LCD substrate, a glass substrate, a CD substrate, a photomask, a print substrate, a ceramic substrate or the like is applicable to the object to be processed by the present apparatus and method.

As mentioned above, according to the cleaning apparatus of the present invention, since it includes the rinsing means for rinsing the object by the rinsing and the drying means for drying the rinsed object while cooling it, it is possible to restrict the occurrence of water marks on the wafer surface to the utmost.

Further, according to the cleaning apparatus of the present invention, since it includes the rinsing means for rinsing the object to be processed by using rinsing liquid; the blowing means for blowing the cooled gas of the mixture of organic solvent and inert gas against the object rinsed by the rinsing means; the drying means for drying the object by blowing cooled gas containing inert gas against the object; and the normalizing means for normalizing the temperature of the object by blowing the gas of normal temperature containing inert gas against the object dried by the drying means, it is possible to restrict the occurrence of water marks on the wafer surface to the utmost and prevent the frost from sticking on the object.

Furthermore, according to the cleaning method of the present invention, since it includes the rinsing step of rinsing the object by the rinsing and the drying step of drying the rinsed object in the cooling system, it is possible to restrict the occurrence of water marks on the wafer surface to the utmost.

Further, according to the cleaning method of the present invention, since it includes the rinsing step of rinsing the object to be processed by using rinsing liquid; the blowing step of blowing the cooled gas of the mixture of organic solvent and the inert gas against the object rinsed by the rinsing means; the drying step of drying the object by blowing cooled gas containing the inert gas against the object; and the normalizing step of normalizing the temperature of the object by blowing the gas of normal temperature containing the inert gas against the object dried by the inert gas, it is possible to restrict the occurrence of water marks on the wafer surface to the utmost and prevent frost from sticking on the surface of the object.

Further, according to the cleaning apparatus of the present invention, since it comprises the processing bath for storing processing liquid in which the object is immersed; the drying chamber arranged above the processing bath and provided with the opening which is disposed between the body of the drying chamber and the processing bath and through which the object is transported, the opening being adapted so as to open and close; the transporting means for transporting the object between the processing bath and the drying chamber through the opening; and the first blowing means arranged in the drying chamber, for blowing gas containing cooled inert gas against the object, it is possible to restrict the occurrence of water marks on the wafer surface to the utmost. Further, the object has no possibility to receive the bad influence from the chemical treatment during the drying process. Further, owing to the enhanced degree of freedom in the process design, it is possible to optimize the cleaning process and miniaturize the cleaning apparatus furthermore, whereby the drying process can be accomplished more effectively.

Further, according to the cleaning apparatus of the present invention, since it comprises the processing bath for storing the processing liquid in which the object is immersed; the drying chamber arranged above the processing bath and provided with an opening which is disposed between a body of the drying chamber and the processing bath and through which the object is transported, the opening being adapted so as to open and close; the transporting means for transporting the object between the processing bath and the drying chamber through the opening; the blowing means for blowing the cooled gas of the mixture of organic solvent and inert gas against the object; the drying means for drying the object by blowing cooled gas containing inert gas against the object; and the normalizing means for normalizing the temperature of the object by blowing the gas of normal temperature containing the inert gas against the object dried by the drying means, it is possible to restrict the occurrence of water marks on the wafer surface to the utmost and prevent the frost from sticking on the surface of the object. Further the object has no possibility to receive the bad influence from the chemical treatment during the drying process. Further, owing to the enhanced degree of freedom in the process design, it is possible to optimize the cleaning process and miniaturize the cleaning apparatus furthermore, whereby the drying process can be accomplished more effectively.

Further, according to the cleaning method of the present invention, since it includes the steps of (a) immersing the object into the processing bath for storing the processing liquid; (b) transporting the object from the processing bath to the drying chamber arranged above the processing bath through the opening which is capable of opening and closing; (c) closing the opening after the object has been transported to the drying chamber; and (d) blowing the gas containing the cooled inert gas against the object, it is possible to restrict the occurrence of water marks on the wafer surface to the utmost and prevent the frost from sticking on the surface of the object. Further, the object has no possibility to receive the bad influence from the chemical treatment during the drying process. Further, owing to the enhanced degree of freedom in the process design, it is possible to optimize the cleaning process and miniaturize the cleaning apparatus furthermore, whereby the drying process can be accomplished more effectively.

Further, according to the cleaning method of the present invention, since it includes the steps of (a) immersing the object into the processing bath for storing processing liquid; (b) transporting the object from the processing bath to the drying chamber arranged above the processing bath through an opening which is capable of opening and closing; (c) closing the opening after the object has been transported to the drying chamber; (d) blowing the cooled gas of the mixture of organic solvent and inert gas against the object; (e) drying the object by blowing the cooled gas containing the inert gas against the object; and (f) normalizing the temperature of the object by blowing the gas of normal temperature containing the inert gas against the object dried by the inert gas, it is possible to restrict the occurrence of water marks on the wafer surface to the utmost and prevent the frost from sticking on the surface of the object. Further, the object has no possibility to receive the bad influenced from the chemical treatment during the drying process. Further, owing to the enhanced degree of freedom in the process design, it is possible to optimize the cleaning process and miniaturize the cleaning apparatus furthermore, whereby the drying process can be accomplished more effectively.

What is claimed is:

1. A cleaning apparatus comprising:

means for supplying a cooled gas having a temperature cooler than a normal temperature of gas within said apparatus;

normal temperature gas supply means for supplying gas at said normal temperature that is higher then the temperature of said cooled gas;

rinsing means for rinsing an object to be processed by using rinsing liquid;

blowing means for blowing cooled gas against said object rinsed by said rinsing means;

drying means for drying said object by blowing said cooled gas against said object; and normalizing means for normalizing a temperature of said object by blowing gas from said normal temperature gas supply means against said object dried by said drying means.

2. A cleaning apparatus comprising:

means for supplying a cooled gas having a temperature cooler than a normal temperature of said gas within said apparatus;

normal temperature gas supply means for supplying gas at said normal temperature that is higher than the temperature of said cooled gas;

rinsing means for rinsing an object to be processed by using rinsing liquid;

blowing means for blowing cooled gas supplied by said supplying means, said cooled gas being obtained by mixing organic solvent with inert gas, said blowing means blowing said cooled gas against said object rinsed by said rinsing means;

drying means for drying said object by blowing cooled gas containing inert gas, against said object; and normalizing means for normalizing a temperature of said object by blowing gas of said normal temperature containing inert gas, against said object dried by said drying means.

3. A method of cleaning an object to be processed, said method comprising the steps of:

rinsing said object by using rinsing liquid;

blowing cooled gas that has been cooled to a temperature cooler than a normal temperature against said object thus rinsed;

drying said object by blowing said cooled gas against said object; and normalizing a temperature of said object by blowing gas of said normal temperature against said object dried by said cooled gas.

4. A method of cleaning an object to be processed, said method comprising the steps of:

rinsing said object by using rinsing liquid;

blowing a first cooled gas that has been cooled to a temperature lower than a normal temperature and that has been obtained by mixing organic solvent with inert gas, against said object rinsed;

drying said object by blowing a second cooled gas that has been cooled to a temperature lower than a normal temperature and that contains inert gas, against said object; and normalizing a temperature of said object by blowing gas of said normal temperature and containing inert gas, against said object dried by said second cooled gas.

5. A cleaning apparatus for cleaning an object to be processed, said apparatus comprising:

means for supplying gas that is cooled to a temperature below a temperature of other gases supplied in said cleaning apparatus, said cooled gas including an inert gas;

a processing bath for storing processing liquid in which said object is immersed;

a drying chamber arranged above said processing bath and provided with an opening which is disposed between a body of said drying chamber and said processing bath and through which said object is transported, said opening being capable of closing;

transporting means for transporting said object between said processing bath and said drying chamber through said opening; and first blowing means arranged in said drying chamber, for blowing gas containing said cooled inert gas against said object.

6. A cleaning apparatus as claimed in claim 5, further comprising:

second blowing means arranged between said processing bath and said drying chamber, for blowing said gas containing said cooled inert gas against said object on transportation from said processing bath to said drying chamber.

7. A cleaning apparatus as claimed in claim 5, further comprising:

cooling means arranged in said drying chamber, for cooling said object.

8. A cleaning apparatus as claimed in claim 5, wherein said first blowing means blows said gas containing said cooled inert gas over said object from an upper section of said drying chamber in a downward flowing manner; and further comprising:

discharging means for discharging said gas containing said inert gas, which has been blown out from said first blowing means, from a lower section of said drying chamber;

wherein said discharging means is provided with an exhaust port through which said gas is discharged from said drying chamber.

9. A cleaning apparatus as claimed in claim 8, further comprising rectifying means communicating with said exhaust port and having a plurality of intake ports for introducing said gas containing said cooled inert gas, which has been blown out from said first blowing means, through a lower section of said drying chamber.

10. A cleaning apparatus as claimed in claim 5, wherein said processing liquid stored in said processing bath is a deaerated rinse.

11. A cleaning apparatus as claimed in claim 5, wherein said processing liquid stored in said processing bath is a cooled rinse.

12. A cleaning apparatus for cleaning an object to be processed, said apparatus comprising:

means for supplying cooled gases having a temperature cooler than a normal temperature of gas within said apparatus, said cooled gases including an organic solvent and inert gas;

normal temperature gas supply means for supplying gas at said normal temperature that is higher than the temperature of said cooled gases;

a processing bath for storing processing liquid in which said object is immersed;

a drying chamber arranged above said processing bath and provided with an opening which is disposed between a body of said drying chamber and said processing bath and through which said object is transported, said opening being adapted so as to open and close;

transporting means for transporting said object between said processing bath and said drying chamber through said opening;

blowing means for blowing a first cooled gas of a mixture of said organic solvent and said inert gas against said object;

drying means for drying said object by blowing a second cooled gas containing said inert gas against said object; and normalizing means for normalizing a temperature of said object by blowing gas of normal temperature containing inert gas against said object dried by said drying means.

13. A cleaning method of cleaning an object to be processed, said cleaning method comprising the steps of:

(a) immersing said object into a processing bath for storing processing liquid;

(b) transporting said object from said processing bath to a drying chamber arranged above said processing bath through an opening which is capable of opening and closing;

(c) closing said opening after said object has been transported to said drying chamber; and (d) blowing gas containing cooled inert gas against said object transported into said drying chamber, said inert gas being cooled to a temperature below a temperature of other gases supplied to said chamber.

14. A cleaning method of cleaning an object to be processed, said cleaning method comprising the steps of:

(a) immersing said object into a processing bath for storing processing liquid;

(b) transporting said object from said processing bath to a drying chamber arranged above said processing bath through an opening which is capable of opening and closing;

(c) closing said opening after said object has been ported to said drying chamber;

(d) blowing cooled gas that has been cooled to a temperature lower than a normal temperature and that includes a mixture of an organic solvent and inert gas, against said object;

(e) drying said object by blowing a second cooled gas that has been cooled to a temperature lower than a normal temperature and that contains insert gas, against said object; and (f) normalizing a temperature of said object by blowing gas of said normal temperature and containing inert gas against said object dried by said inert gas in step (e).

15. A cleaning method as claimed in claim 13 wherein, prior to said step of (b), said drying chamber has been filled up with a cooled and rarefied atmosphere of an organic solvent.

16. A cleaning method as claimed in claim 14, wherein, prior to said step of (b), said drying chamber has been filled up with a cooled and rarefied atmosphere of the organic solvent.

* * * * *